United States Patent
Matsushita

[11] Patent Number: 5,812,413
[45] Date of Patent: Sep. 22, 1998

[54] RESTRUCTURE SUPPORT DEVICE AND METHOD FOR PRINTED-WIRING BOARD

[75] Inventor: Hideharu Matsushita, Kawasaki, Japan

[73] Assignee: Fujitsu Limited, Kawasaki, Japan

[21] Appl. No.: 396,108

[22] Filed: Feb. 28, 1995

[30] Foreign Application Priority Data

Apr. 4, 1994 [JP] Japan ................................ 6-065771

[51] Int. Cl.⁶ .................................................. G06F 17/50
[52] U.S. Cl. .......................................... 364/489; 364/488
[58] Field of Search .................................. 364/488, 489, 364/490, 491, 468

[56] References Cited

U.S. PATENT DOCUMENTS

| | | | |
|---|---|---|---|
| 4,469,553 | 9/1984 | Whitehead | 156/627 |
| 4,571,072 | 2/1986 | Bourbeau, Jr. et al. | 355/79 |
| 4,588,468 | 5/1986 | McGinty et al. | 156/345 |
| 4,768,154 | 8/1988 | Sliwkowski | 364/468 |
| 4,805,113 | 2/1989 | Ishii et al. | 369/491 |
| 5,181,317 | 1/1993 | Nisihara et al. | 29/401.1 |
| 5,315,535 | 5/1994 | Kikuchi et al. | 364/490 |
| 5,414,637 | 5/1995 | Bertin et al. | 364/489 |
| 5,473,547 | 12/1995 | Muroga | 364/489 |
| 5,502,644 | 3/1996 | Hamilton et al. | 364/488 |
| 5,544,088 | 8/1996 | Aubertine et al. | 364/489 |

FOREIGN PATENT DOCUMENTS

| | | |
|---|---|---|
| 3-262080 | 11/1991 | Japan . |
| 3-269767 | 12/1991 | Japan . |

Primary Examiner—Kevin J. Teska
Assistant Examiner—Leigh Marie Garbowski
Attorney, Agent, or Firm—Staas & Halsey

[57] ABSTRACT

A net can be automatically restructured even if input new circuit data of a net relate to a special system in which the connection order of terminals is restricted as in a net of an ECL system. The automatic restructure is performed by generating connection restructure data required to connect on a printed distribution frame all terminals connected to the net of the new circuit according to the information specifying the connection order of the terminals in the net.

32 Claims, 36 Drawing Sheets

FIG. 3A

| 01 VERSION CIRCUIT (01 VERSION CIRCUIT DATA) 21b | | | 02 VERSION CIRCUIT (02 VERSION CIRCUIT DATA) 22b | | |
|---|---|---|---|---|---|
| PARTS NUMBER | BIN NUMBER | PIN ATTRIBUTES | PARTS NUMBER | BIN NUMBER | PIN ATTRIBUTES |
| I10 | -01 | O | I10 | -01 | O |
| I20 | -01 | — | I20 | -01 | — |
| I30 | -01 | — | I30 | -01 | — |
| R10 | -01 | R | R20 | -01 | R |

FIG. 3B
*(PRIOR ART)*

(DIFFERENCE EXTRACTION RESULT)
DELETE PIN R10-01
ADD PIN R20-01

PERFORMING TTL AUTOMATIC RESTRUCTURE

CONNECTED: R20-01===I10-01

DISCONNECTED: C1

ARRANGING IN ECL CONNECTION ORDER

SINCE ECL CONNECTION IS [IO-01(O)-I20-01(I)-I30-01(I)--R20-01(R)], THEN LINE R20-01==I10-P1 IS DELETED AND LINE R20-01==I30-01 IS PROVIDED

FIG. 18A

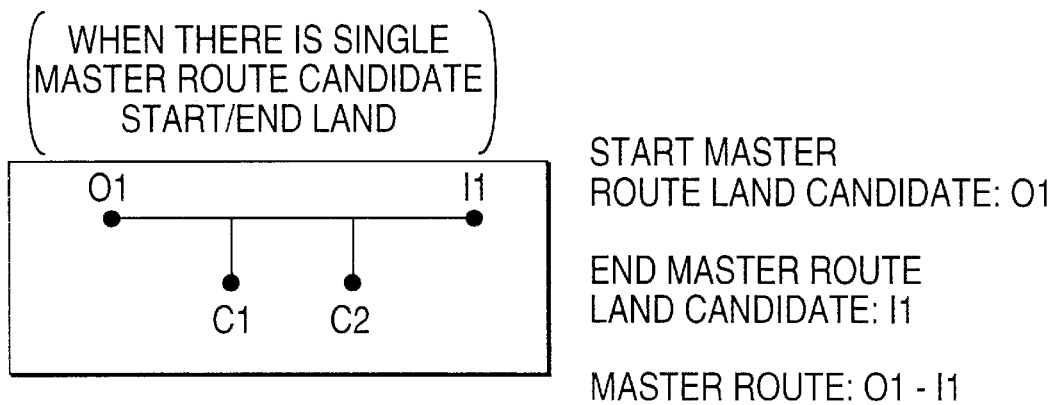

(WHEN THERE IS SINGLE MASTER ROUTE CANDIDATE START/END LAND)

START MASTER ROUTE LAND CANDIDATE: O1

END MASTER ROUTE LAND CANDIDATE: I1

MASTER ROUTE: O1 - I1

FIG. 18B

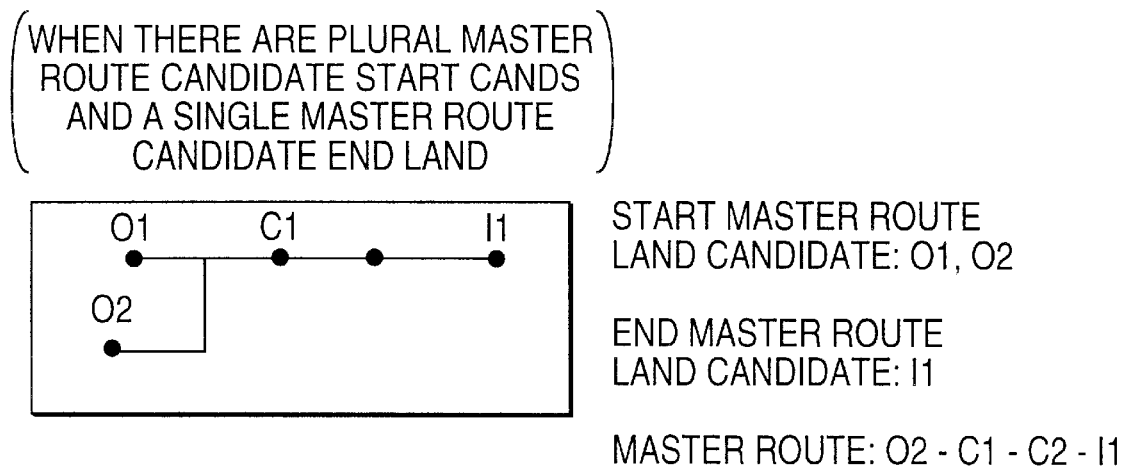

(WHEN THERE ARE PLURAL MASTER ROUTE CANDIDATE START CANDS AND A SINGLE MASTER ROUTE CANDIDATE END LAND)

START MASTER ROUTE LAND CANDIDATE: O1, O2

END MASTER ROUTE LAND CANDIDATE: I1

MASTER ROUTE: O2 - C1 - C2 - I1

FIG. 18C

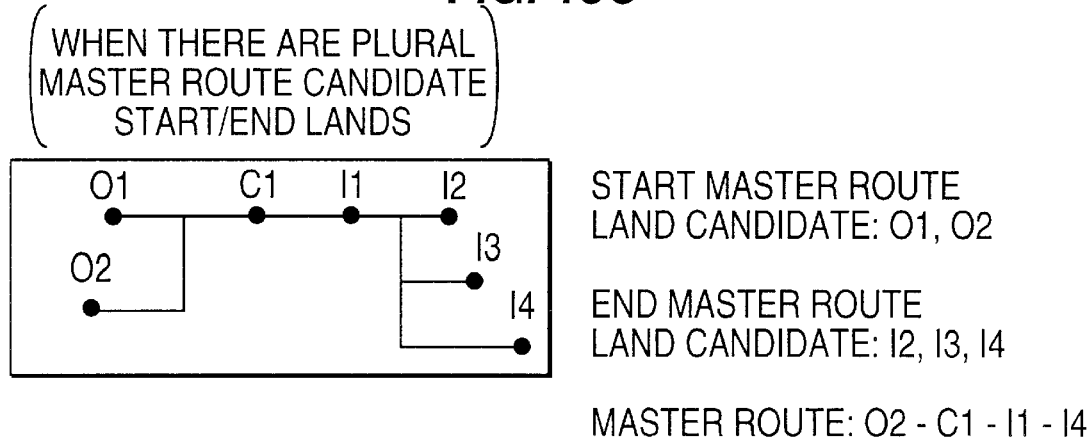

(WHEN THERE ARE PLURAL MASTER ROUTE CANDIDATE START/END LANDS)

START MASTER ROUTE LAND CANDIDATE: O1, O2

END MASTER ROUTE LAND CANDIDATE: I2, I3, I4

MASTER ROUTE: O2 - C1 - I1 - I4

STATE OF PRINTED FRAME

RESULTANT STATE OF DELETION PROCESS

FIG. 22C ECL INAPPLICABLE CONNECTION
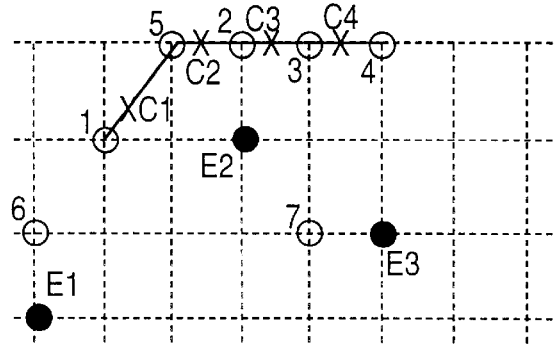
FIG. 22D RESULTANT STATE OF ADDITION PROCESS
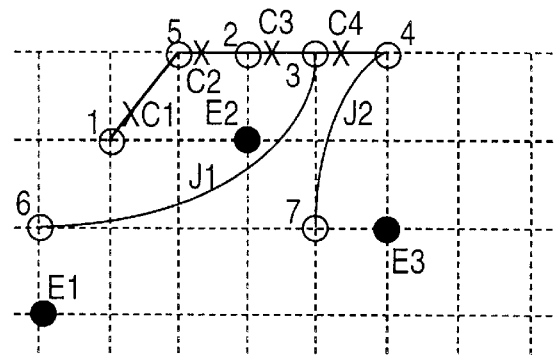
FIG. 22E CONNECTING NEW NET
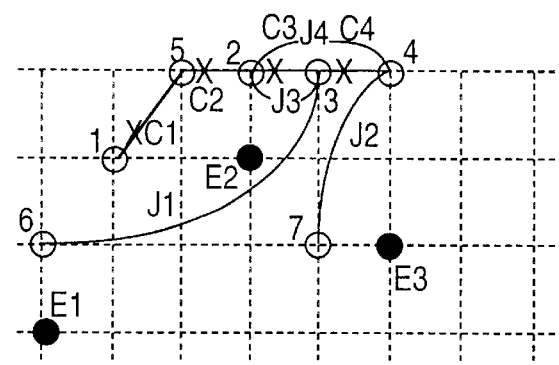
FIG. 22F GENERATING DOUBLE LINES
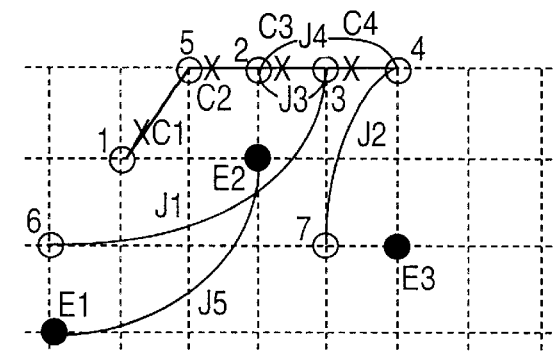

FIG. 23B

PARTS TERMINAL TECHNOLOGY FILE — 222

| NO | PARTS SPECIFICATION | PIN NUMBER | ECL SECTION | TECHNOLOGY NAME |
|---|---|---|---|---|
| 1 | SS1 | 01 | TTL | T1 |
| 2 | SS2 | 01 | ECL | E1 |

SINCE NET IS OF TTL SYSTEM, CONNECTION IS MADE REGARDLESS OF CONNECTION ORDER.

FIG. 23C

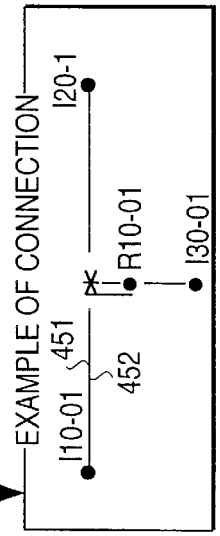

EXAMPLE OF CONNECTION

CIRCUIT DATA USED IN DESIGNING FIRST PATTERN — 440

| PARTS NAME | PARTS SPECIFICATION | PIN NUMBER | ATTRIBUTE |
|---|---|---|---|
| I10 | ( SS1 ) | 01 | (O:OUTPUT) |
| I20 | ( SS1 ) | 01 | (I:INPUT) |
| I30 | ( SS1 ) | 01 | (I:INPUT) |
| R10 | ( RR1 ) | 01 | (R:TERMINAL RESISTOR) |

PARTS TERMINAL TECHNOLOGY FILE USED IN DESIGN AND RESTRUCTURE PROCESSES — 222

| NO | PARTS SPECIFICATION | PIN NUMBER | ECL SECTION | ECL TECHNOLOGY NAME |
|----|---------------------|------------|-------------|---------------------|
| 1  | SS1                 | 01         | ECL         | E1                  |
| 2  | SS2                 | 01         | ECL         | E1                  |

SINCE NET IS OF ECL SYSTEM, CONNECTION IS MADE IN DEFINED CONNECTION ORDER.

EXAMPLE OF RESTRUCTURE

FIG. 25A

CIRCUIT DATA USED IN DESIGNING FIRST PATTERN — 440

| PARTS NAME | PARTS SPECIFICATION | PIN NUMBER | ATTRIBUTE |
|---|---|---|---|
| I10 | (SS1) | 01 | (O:OUTPUT) |
| I20 | (SS1) | 01 | (I:INPUT) |
| I30 | (SS1) | 01 | (I:INPUT) |
| R10 | (RR1) | 01 | (R:TERMINAL RESISTOR) |

FIG. 25B

PARTS TERMINAL TECHNOLOGY FILE USED IN DESIGN AND RESTRUCTURE PROCESS — 222

| NO | PARTS SPECIFICATION | PIN NUMBER | ECL SECTION | ECL TECHNOLOGY NAME |
|---|---|---|---|---|
| 1 | SS1 | 01 | ECL | E0 |
| 2 | SS2 | 01 | ECL | E1 |

FIG. 25C

TECHNOLOGY FILE — 223

| TECHNOLOGY NAME | ANTENNA LENGTH | LENGTH FOR DOUBLE LINE | LENGTH OF EARTH LAND | BRANCH LENGTH |
|---|---|---|---|---|
| E0 | 5080 | 12700 | 2540 | 5080 |
| E1 | 5080 | 25400 | 2540 | 2540 |

NET IS CONNECTED BASED ON ECL CONNECTION (ACCORDING TO E0 STANDARD) →

FIG. 25D

EXAMPLE OF CONNECTION

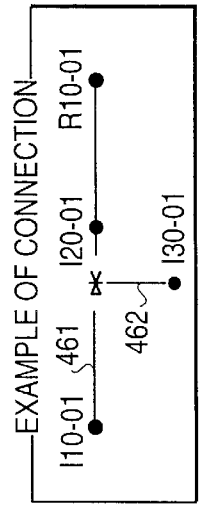

I10-01  461  I20-01  R10-01

462  I30-01

PARTS TERMINAL TECHNOLOGY FILE USED IN DESIGN AND RESTRUCTURE PROCESSES — 222

| NO | PARTS SPECIFICATION | PIN NUMBER | ECL SECTION | TECHNOLOGY NAME |
|----|---------------------|------------|-------------|-----------------|
| 1  | SS1                 | 01         | ECL         | E0              |
| 2  | SS2                 | 01         | ECL         | E1              |

→ NET SHOULD BE RESTRUCTURED AS ECL SYSTEM (ACCORDING TO E1 STANDARD). IF NOT, BRANCH LENGTH ERROR OCCURS.

EXAMPLE OF RESTRUCTURE

I10-01   I20-01   R10-01

461   462   463   I30-01

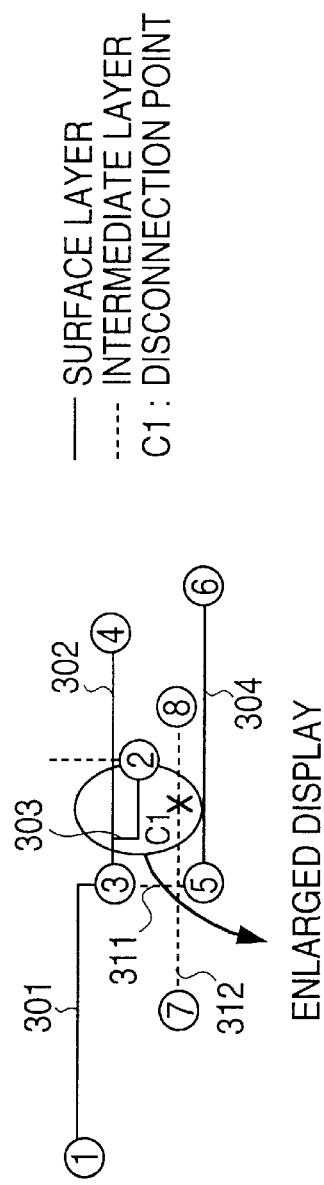
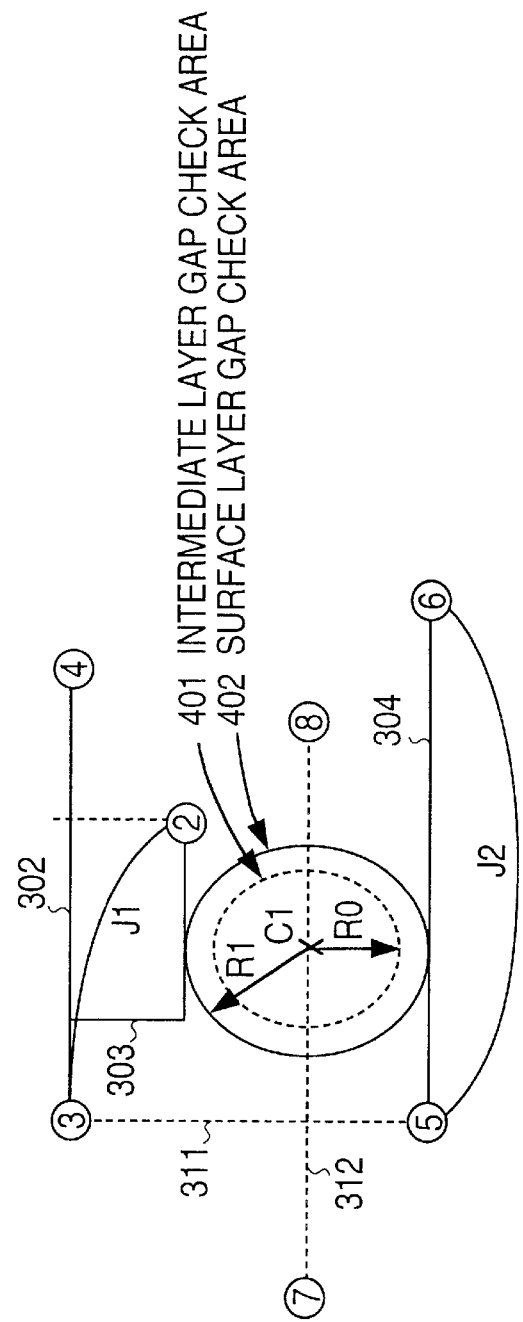
FIG. 27A
FIG. 27B

FIG. 28

```
┌─────────── IN RESTRUCTURE DATA ───────────┐
│                  BASE 203                  │
│ <LINE>                                     │
│         VERSION   ROUTE    BACKUP                    ROUTE │
│ NO.     NO.      REQUIRED  LINE MK  FROM  TO  POINT │
│  1      01                    Q      ③  == ②    ○  │
│  2      01                    Q      ⑤  == ⑥    ○  │
└────────────────────────────────────────────┘
```

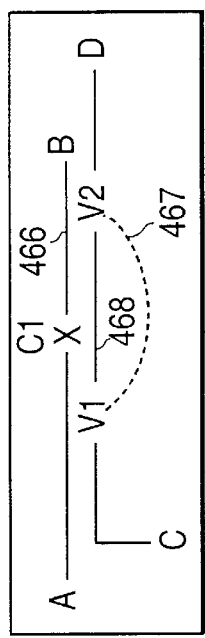
FIG. 29A
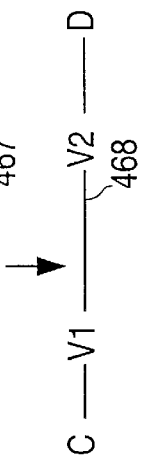
FIG. 29D
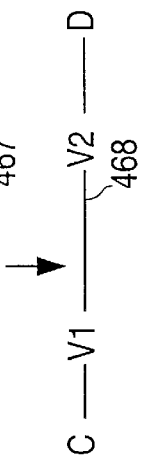
FIG. 29E
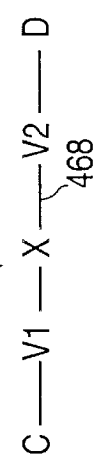
FIG. 29F
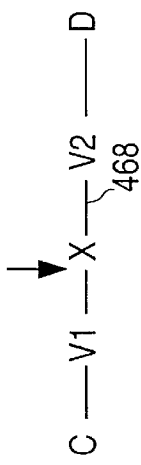
FIG. 29B
FIG. 29C

FIG. 30

CONNECTION LINE GENERATION
PRIORITY RULE

| | MAXIMUM NUMBER OF LINES | PRIORITY |
|---|---|---|
| ■ THROUGH-PARTS LAND | -2 | 1 |
| VIA | 1 | 2 |
| SMD PARTS LAND | 1 | 3 |

■ UNDER-PARTS VIA PROHIBITION CONDITION: PROHIBITED

FIG. 34A
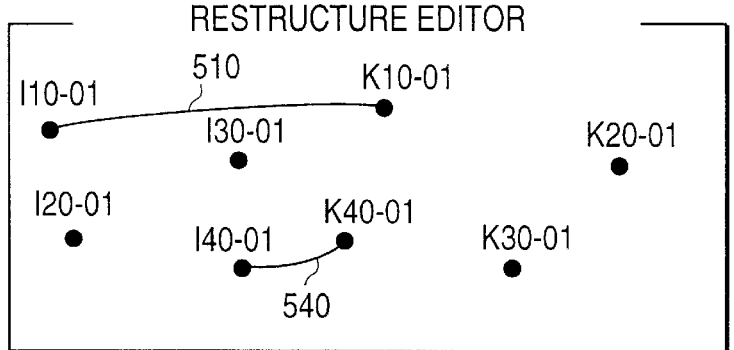
DISPLAYING CONNECTION LINES TO BE ASSIGNED CONNECTION ROUTE BY RESTRUCTURE EDITOR
FIG. 34B
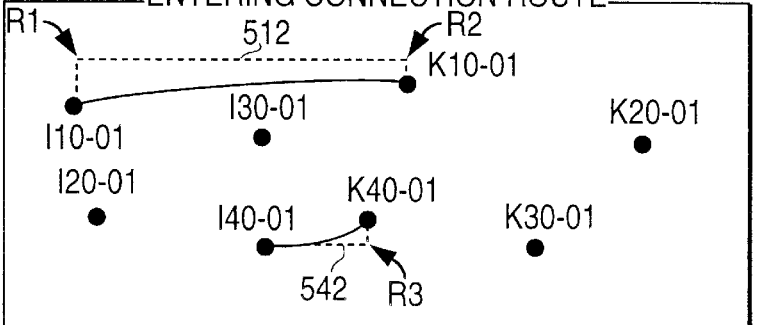
ENTERING CONNECTION ROUTE
OUTPUT OF DATA BASE
FIG. 34C
```
              IN RESTRUCTURE DATA BASE 203
⟨LINE⟩
        VERSION  ROUTE     BACKUP                        ROUTE
NO.     NO.      REQUIRED  MK      FROM       TO         POINT
1       01       O                 I10-01  ===  K10-01   1
2       01       X                 I20-01  ===  K20-01   0
3       01       X                 I30-01  ===  K30-01   0
4       01       O                 I40-01  ===  K40-01   2
⟨ROUTE⟩
        POINT              POINT
NO.     NUMBER             POSITION
1       2                  R1, R2
2       1                  R3
```

FIG. 35A
DIFFERENCE EXTRACTION DATA
```
A    D    (DELETED)
B    =
C    =
D    =
X    A    (ADDED)
Y    A    (ADDED)
```
FIG. 35B
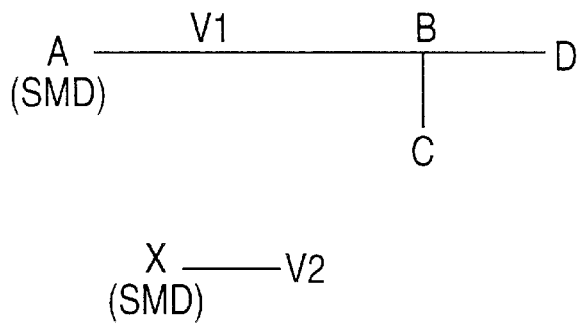
STATE OF INITIAL PATTERN
FIG. 35C
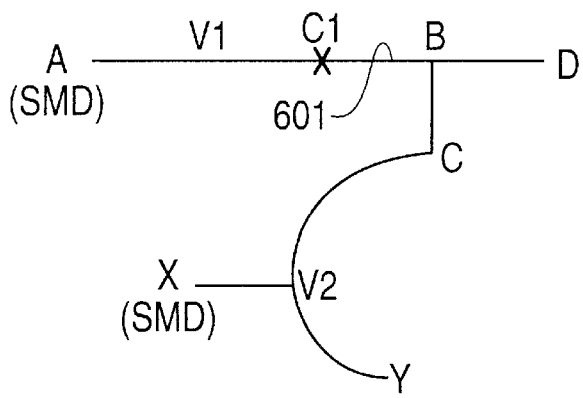
RESTRUCTURE RESULT

FIG. 36A
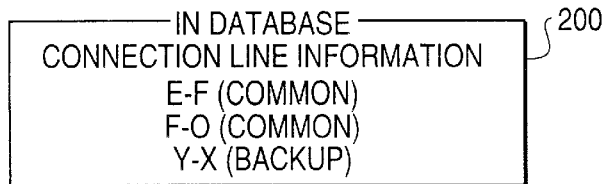
FIG. 36B
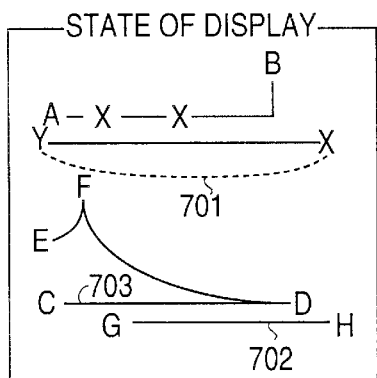
FIG. 36C
EXECUTING CONNECTION LINE DELETE COMMAND
FIG. 36D
WHEN X-Y LINE IS SELECTED
FIG. 36E
─OUTPUT OF MESSAGE─
BACKUP LINE HAS BEEN SELECTED.
DELETE?
YES    NO
FIG. 36F
DISPLAYING RESULT OF SCREEN
FIG. 36G
DISCONNECTING BETWEEN G AND H
FIG. 36H
GENERATION CHECK OF EXISTING BACKUP LINE
FIG. 36I
DISPLAYING BACKUP LINE
FIG. 36K
IS PRESENT BACKUP LINE
ON DISPLAY OK?
YES    NO
FIG. 36J
FIG. 36L

RESTRUCTURE SUPPORT DEVICE AND METHOD FOR PRINTED-WIRING BOARD

BACKGROUND OF THE INVENTION

1. Field of the Invention

The present invention relates to a device and a method of supporting the restructure of a printed distributing frame.

2. Description of the Related Art

Electronic apparatuses and systems demand smaller, light-weight, and high-performance devices. To attain this, high-density packaging technologies are required in designing the apparatuses and systems.

Thus, the high-density packaging technologies are also required in structuring a printed distribution frame, and the density in wiring connection and parts packaging is getting higher. Under such circumstances, printed distribution frames have multilayers and a larger number of electronic parts are mounted onto their surfaces. Communications devices and computer systems additionally demand higher-speed processes. In particular, an interface unit of a switch operated in an asynchronous transfer mode (ATM) in a broadband ISDN (B-ISDN) of the newest generation requires a high-speed operation of, for example, 150 MHz, 2.4 GHz, etc. Therefore, gates of the TTL level are limited and should be replaced with those of the ECL level. The ECL-level gates have had a demerit of consuming a large amount of electric power, but have been improved to considerably reduce the consumption of the electric power by realizing the active pull-down (APD) circuit technologies for practical use.

Therefore, ICs and LSIs operating with the I/O at the ECL level will take important parts in the latest packaging technologies of the printed distribution frames.

Recently, the printed distribution frames are automatically designed by the CAD (computer aided design). Since the ICs and LSIs of ECL-level I/Os (hereinafter referred to as ECL I/O ICs and ECL I/O LSIs for short) and surface-mounted devices (SMD) have been widely utilized, a part of existing printed distribution frames are likely to be replaced with these ECL I/O ICs, ECL I/O LSIs, or SMDs.

Conventionally, these printed distribution frames have been restructured according to the procedure shown on the flowchart in FIG. 1. Assume that a mounting data base DB 20 has already stored a first pattern data 21*a* and a first circuit data (01 version circuit data) 21*b*. The first pattern data 21*a* comprises parts information, wiring pattern information (line data, via data, land data, etc.), net information, etc. First, the second version circuit chart is designed and entered in a work station and the like using a circuit chart editor, etc. to generate a circuit interface (I/F) file 10. The circuit I/F file 10 stores circuit information including the information of parts (parts names, mounting position names, parts specifications, etc.) mounted on a printed distribution frame and connection information, etc. representing each net.

Then, the circuit information (parts information, net connection information) are read from the circuit I/F file 10. Next, unknown mounting position (mounting coordinate) and mounted surface data are added to the parts information, and stored in the mounting database 20 as a second version circuit data (02 version circuit data) 22*b* (S2).

Using an engineering change (EC) editor 40, unknown data of newly added parts (mounting position names, mounted positions, and mounted surfaces) are added and entered to the 02 version circuit data 22*b* (S3).

An automatic restructure tool is operated in a work station, then performed is an automatic restructure process S4 whose detailed steps are shown on the flowchart in FIG. 2 to generate a 01 version restructure data 23 comprising connection line information, disconnection information of a wiring pattern, etc.

In the procedure of the automatic restructure process shown on the flowchart in FIG. 2, the 01 version circuit data 21*b* and the 02 version circuit data 22*b* are read from the mounting database 20 and compared with each other to extract difference data (delete pin, add pin, etc.) and store them in a difference file 30 (S21).

Thus, the difference data, for example, as shown in FIG. 3B, are extracted from the 01 version circuit data 21*b* and the 02 version circuit data 22*b* shown in FIG. 3A. That is, R10-01 and R20-01 are extracted as a delete pin and an add pin respectively.

Next, it is checked whether or not the difference data are extracted and stored in the difference file 30 (S22). If the difference data exist, it is sequentially checked whether or not an excess connection (wiring) to be deleted exists based on the information of delete pins (S23). If the excess connection actually exists, the connection line should be disconnected to delete the excess connection pin (delete pin) (S24). This process is performed on all excess connections.

If all the disconnection processes (S24) have been completed, it is checked according to the difference data whether or not there is a pin in need of connections, that is, an unconnected add pin (S25). If yes, a first line connection process is performed by adding and connecting the add pin to a new series (a new net) (S26).

If the first line connection process S26 has been completed, it is checked whether or not the connection of the new series is correct, that is, whether or not there is an unconnected pin (S27). If yes, the unconnected pin is duly connected in a second line connection process (S28).

The second line connection process S28 is performed when the connection among, for example, A, B, and C (where A, B, and C indicate the names of pins) in an old circuit is changed into the connection between A and C in a new circuit.

That is, since pin B is a delete pin in this case, the first disconnection process in step S24 keeps pin A and pin C unconnected to each other. As pin A and pin C have been used in the old circuit, they are not processed in the connection process in step S26. Therefore, pin A and pin C are connected to each other in the process in step S28.

In the above described automatic restructure process, the pattern of the printed distribution frame shown in FIG. 4A corresponding to the old circuit data shown in FIG. 3A is altered based on the difference data shown in FIG. 3B into the pattern shown in FIG. 4B. That is, the pattern in which two pins R10-01 and I30-01 are connected to each other is changed such that the two pins are disconnected at position C1 and new pins R20-01 and I10-01 are connected to each other by line 61. The line connection and disconnection information is stored in the 01 version restructure file 23.

The automatic restructure process presently only supports a TTL-system net, but does not support an ECL-system net. Accordingly, it requires a manual check as to whether or not the ECL-system net has been automatically and correctly restructured. It further requires a restructure depending on the check result as described later.

Back to the flowchart shown in FIG. 1, the 01 version restructure data are amended (S7) using the EC editor if an error is detected in a check (S5 and S6) of the amended restructure based on the rules of the TTL-system design by referring to the 01 version circuit data 21*b*, first pattern data 21*a*, and 01 version restructure data 23 after the automatic restructure process S4 performed according to the rules of the TTL-system design. In this amendment, connected pins may be disconnected, and lines may be added or deleted.

If no errors are detected any more according to the rules of the TTL-system design after the amendment by the EC editor 40, then the following processes are manually performed.

1. ECL-system restructure process
2. Backup line process
3. Line routing process
4. Virtual pin process for an SMD leading via
5. Process result checking process for 1~4

If the manual operations for the 1~5 have been completed, then the restructuring manufacture information obtained by the operations 1~4 is output to a form 55 and transmitted to a printed distribution frame assembly factory.

In the TTL-system net, a restructuring manufacture data generation tool is executed in a work station to generate and output line data 51 and disconnection data 52 necessary to actually restructure the printed distribution frame at a factory by referring to the 02 version circuit data 22*b*, first pattern data 21*a*, and 01 version restructure data 23. Then, the data 51 and 52 are delivered to a printed distribution frame assembly factory 7, thereby actually restructuring the printed distribution frame in the factory using the information of the line data 51, disconnection data 52, and form 55.

As described above, the current printed distribution frame restructure design support system has not been sufficiently improved to apply to the change in circuit design such as ECL I/O ICs, ECL I/O LSIs, a larger number of SMDs, and high-density packages. Accordingly, the above listed processes 1 through 5 are still performed manually as explained below.

ECL-system restructure process

In an ECL-system (ECL-mounting) restructure process, a high-frequency signal is transmitted, thereby causing a problem of reflection of the signal due to the inconsistency in impedance. ICs and LSIs are interconnected in a long series with the terminal of the connection provided with a terminal resistor for impedance matching. That is, a branch cannot be optionally made as in the TTL-system process, but requires the terminal resistor at the terminal of the connection for impedance matching, thereby necessarily restructuring the ECL system in a predetermined connection order. Since the ECL system is restructured also in the TTL-system automatic restructure process, the system is restructured in the connection order of the ECL-system process as shown in FIG. 4B.

In FIG. 4B, I10-01 is an output pin of the ECL level, and I20-01 and I30-01 are input pins of the ECL level. R10-01 is a resistor (terminal resistor). In the ECL-system process, these pins must be connected in the order of an output pin, input pin, input pin, and terminal resistor. Therefore, the connection shown in FIG. 4B is manually changed according to the above described connection order into the connection shown in FIG. 4C. That is, line 61 between R20-01 (terminal resistor) and I10-01 (ECL input pin) is deleted. Instead, line 63 is added to connect R20-01 to I30-01 (ECL input pin) to connect I10-01 (ECL output), I20-01 (ECL input), I30-01 (ECL input), and R20-01 (terminal resistor) in this order.

Thus, if the ECL-system net is manually changed after an automatic restructure, the change is not reliable because it is made manually. Additionally, the manual change takes a longer time and therefore is more inefficient than an automatic restructure. If the ECL-system restructure is performed on a portion other than an ECL system in the manual operation, then an excess disconnection or connection is made, thereby lowering the reliability of the restructuring manufacture data.

On the other hand, if the ECL-system restructure is completed manually, then the total job steps are large in number and the time required for the job is very long. Furthermore, since the check is visually made after the manual restructure, the restructuring manufacture data are considerably lowered in reliability.

Backup line process

Since a densely mounted surface is designed with connection lines also designed densely, thinner lines are used and the number of lines increases between pins of LSIs or ICs. Accordingly, the lines are arranged so closely that adjacent lines may be disconnected by accident when a connection is disconnected. Therefore, if a disconnection is made and affects some adjacent lines as described above in an automatic restructure, then the adjacent lines should be provided with supplementary lines (backup lines). However, the current automatic restructure tool does not support this backup function.

Under such circumstances, all disconnected portions are manually checked after an automatic restructure and the backup lines are manually added to the portions where lines are likely to be disconnected by being affected by a disconnection made at another portion.

For example, if the connection 71 between R10-01 and I30-01 is disconnected (C1) on the printed distribution frame shown in FIG. 5, and the adjacent connection 73 between A and B may be accidentally disconnected, then a backup line is added to support the connection between A and B.

Since the information about the thus generated backup line cannot be entered in the surface-mounting database 20 as 01 version restructure data 23 in the conventional technologies, the information is hard to appropriately manage and prolongs the process time because the subsequent automatic restructure processes become complicated.

If lines are designed with multiple layers, disconnections may be detected not only on the surface, but also on inner layers. In this case, backup lines should be added to the corresponding inner layer and the upper layers, if necessary, after checking the space in the line pattern on each layer. That is, since a disconnection is made using a drilling machine on the surface, the connection on an upper layer may be accidentally disconnected at the corresponding position. Therefore, care must be taken to the connection pattern on upper layers (near the surface layer) as well as the layer to be processed. These processes require a long time and result in low reliability if they are performed manually.

Line routing process

Conventionally, connections are made using so-called jumper cables, and land cables are normally 0.26 mm-diameter jumper cables covered with insulation material. That is, since the electronic parts mounted lands are normally large and spaced in the conventional methods, the jumper cables are used for connection. In this case, the connection process is also manually performed at a factory where two points to be connected to each other should be informed of. However, the connection on a land where SMD terminals are arranged closely requires 0.12 mm-diameter thin jumper cables covered with insulation material. If the thin jumper cables are used for connection, they are fixed onto a printed distribution frame, thereby permitting no manual operations and accelerating the use of automatic line connection devices.

The current automatic line connection devices cannot efficiently route a cable only according to the information of two terminal points, but requires an exact route of the connection specified by the route designer. However, the current automatic restructure tools do not support the generation of such connection route information. That is, it only generates conventional information of jumper cables.

Assume that R20-01 is connected to I30-01 in an automatic restructuring process as shown in FIG. 6. In this case, a connection route 83 should be established using the EC editor 40 as shown by broken lines in FIG. 6 by referring to the disconnection and connection charts output by a tool not shown in FIG. 6 by referring to the first pattern data 21a and 01 version restructure data 23 in the surface-mounting database 20. At this time, connection points of the connection route 83 should be manually entered in the disconnection chart after by referring to the connection chart after an automatic restructure. The time-consuming entry is inefficiently made on the screen by the designer. The entered connection route information cannot be stored as corresponding to the connection data in the 01 version restructure data 23 in the surface-mounting database 20, and therefore the connection route information has to be manually managed in paper form carrying disconnection charts with the connection route information written on them. Thus, additional time-consuming management process is required.

Virtual pin process for an SMD leading via

An SMD has closely arranged terminals. When the SMD is mounted onto a printed distribution frame, the terminals are soldered onto the land (footprint) formed on the surface of the printed distribution frame. Since the SMD has its terminals directly soldered to a land, lines are directly soldered to the land. As a result, an excess thermal stress is applied to the SMD terminals and the SMD may be undesirably deteriorated.

Thus, a soldering process performed on the SMD terminals at the initial design may cause the deterioration of the SMD, that is, the printed distribution frame. Furthermore, connecting SMD terminals for restructure accelerates the deterioration of the SMD.

Therefore, in the case of the SMD, lines are not directly connected to pins as in the case of an IMD (insert-mounted device), but form a pattern in the initial pattern design such that the SMD terminals are connected to a single leader via. A plurality of lines can be connected to a via, and has a merit of establishing a plurality of connection lines for an SMD terminal. Thus, the leader via is combined with the SMD terminals to have the function as an SMD terminal. This is referred to as "a leader via from an SMD terminal as a virtual pin".

However, the current automatic restructure tool is not designed to apply to "a leader via from an SMD terminal as a virtual pin". Therefore, if the connections between SMD terminals A and X and SMD terminals B and Y are automatically restructured into the connections between SMD terminals A and C and SMD terminals between B and D respectively, then the connections between SMD terminal A and its leader via V1 and between SMD terminal B and its leader via V2 are disconnected at C1 and C2 respectively as shown in FIG. 7A, and direct connection lines 91 and 93 are established between SMD terminal A and throughhole land C and between SMD terminal B and throughhole land D respectively. The result of this automatic restructure should be manually amended as shown in FIG. 7B. Required operations in this case are:

Deleting connection lines 91 and 93 between A–C and B–D;

Adding connection lines 95 and 97 between V1–C and V2–D;

Deleting disconnections C1 and C2 between A–V1 and B–V2; and

Adding disconnections C11 and C22 between V1–X and V2–Y.

These operations are performed manually, and takes much time and labor.

Connections 98 and 99 are disconnected between SMD terminal A and its leader via V1 and between SMD terminal B and its leader via V2 as a result of the automatic restructure. Therefore, leaders 98 and 99 and vias V1 and V2 are uselessly provided for restructure at the initial design. Furthermore, it is inefficient that the disconnections C1 and C2 of the leaders 98 and 99 should be manually deleted again.

SUMMARY OF THE INVENTION

The present invention aims at automatically restructuring even a special net such as ECL-system nets, automatically generating a backup line required at a disconnection, efficiently entering a connection route, and enabling an automatic restructure to be performed with the fewest connection lines of SMD terminals.

According to the present invention, it is determined whether or not a net is a special net based on new circuit data of an input net and net determination information required to determine whether or not the net is a special net in which the connection order of terminals is defined. If the net is determined to be a special net, generated according to the connection information defining the connection order of the terminals in the special net is connection restructure data required to connect on a printed distribution frame all terminals of the new circuit of the net.

BRIEF DESCRIPTION OF THE DRAWINGS

FIG. 3A shows the method of extracting difference data from new and old circuit data of a net;

FIG. 3B shows the extracted difference;

FIGS. 18A, 18B, and 18C, show the method of defining a master route in an ECL-system net;

FIGS. 22C through 22F show the automatic restructure process (2) of the ECL-system net;

FIGS. 23A through 23C show the automatic restructure (1) of the ECL-system net in which no logical difference is obtained;

FIGS. 25A through 25D show the automatic restructure (3) of the ECL-system net in which no logical difference is obtained;

FIGS. 27A and 27B show the method of generating a backup line;

FIG. 28 shows the method of setting a mark of a backup line in the line connection information in the restructure data base;

FIGS. 29A through 29F show an example of an effect obtained when a general line and a backup line are entered in the restructure data base in a recognizable format;

FIG. 30 shows the contents of the connection line generation priority rule;

FIGS. 34A through 34C show the state in which the line connection information is read from the line connection information file in the restructure data base;

FIGS. 35A through 35C show the method of generating a connection or a disconnection through a virtual pin of a leader via of SMD terminals; and FIGS. 36A through 36L are flowcharts showing the backup line editing process using the restructure editor of the present embodiment.

DESCRIPTION OF THE PREFERRED EMBODIMENTS

Figure 8:
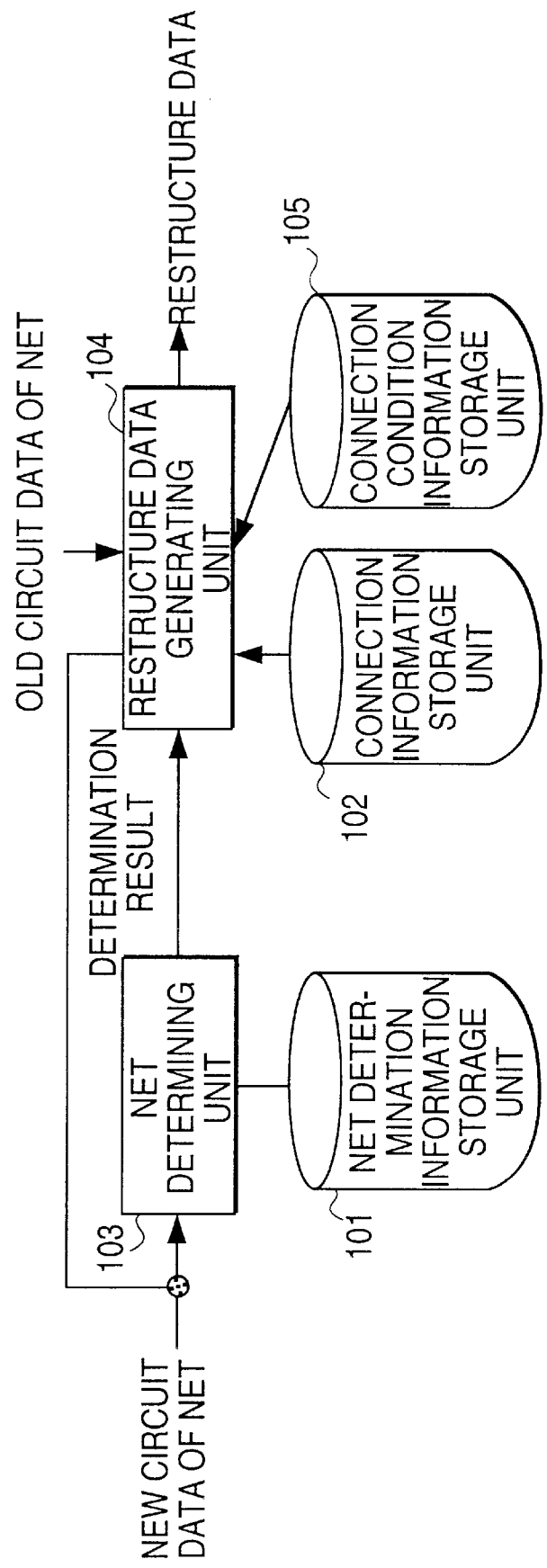
FIG. 8 shows the principle (1) of the present invention.

FIG. 8 shows the principle of the present invention.

A restructure support device of the printed distribution frame shown in FIG. 8 can be designed as follows.

A net determination information storage unit 101 stores information required in determining according to new circuit data of a net whether or not the net is a special net in which the connection order of terminals is limited.

A connection information storage unit 102 stores the information which defines the connection order of terminals in the special net.

A net determining unit 103 receives new circuit data of a net and determines whether or not the net is of a special system based on the new circuit data and the net determination information stored in the net determination information storage unit 101.

A restructure data generating unit 104 extracts delete terminals and add terminals from the net determined to be a special net by the net determining unit 103 according to the data of the old and new circuits, and then generates connection restructure data required to connect all terminals of the new circuit of the net on a printed distribution frame according to the connection order information stored in the connection information storage unit 102.

The special net is of an ECL system for inputting and outputting an ECL-level signal.

If the ECL-system net is processed, the device can further comprise a connection condition information storage unit 105 in which the connection condition of the ECL-system net is defined, and the restructure data generating unit 104 can be designed such that restructure data are generated according to the connection condition stored in the connection condition information storage unit 105.

With the configuration, the limited length of an antenna is set as the connection condition, and the restructure data generating unit 104 can generate data to disconnect the antenna when it is longer than the limited length in the disconnection process.

With the line connection information set for the length of the connection line which requires double connection lines, the restructure data generating unit 104 can generate data to provide another connection line to form double connection lines with a new connection line between terminals which connect to the ground (hereinafter referred to as "earth lands"), if it is longer than a predetermined length. In this case, the range of retrieval of earth lands to be provided with double connection lines is determined as the connection condition. Then, the restructure data generating unit 104 can select an earth land which can be connected with a line within the retrieval range.

A limited value of the length of a branch from a master route can be set as the connection condition. In this case, the restructure data generating unit 104 determines the connection of terminals in consideration of the limited branch length value in addition to the connection order information.

Figure 9:
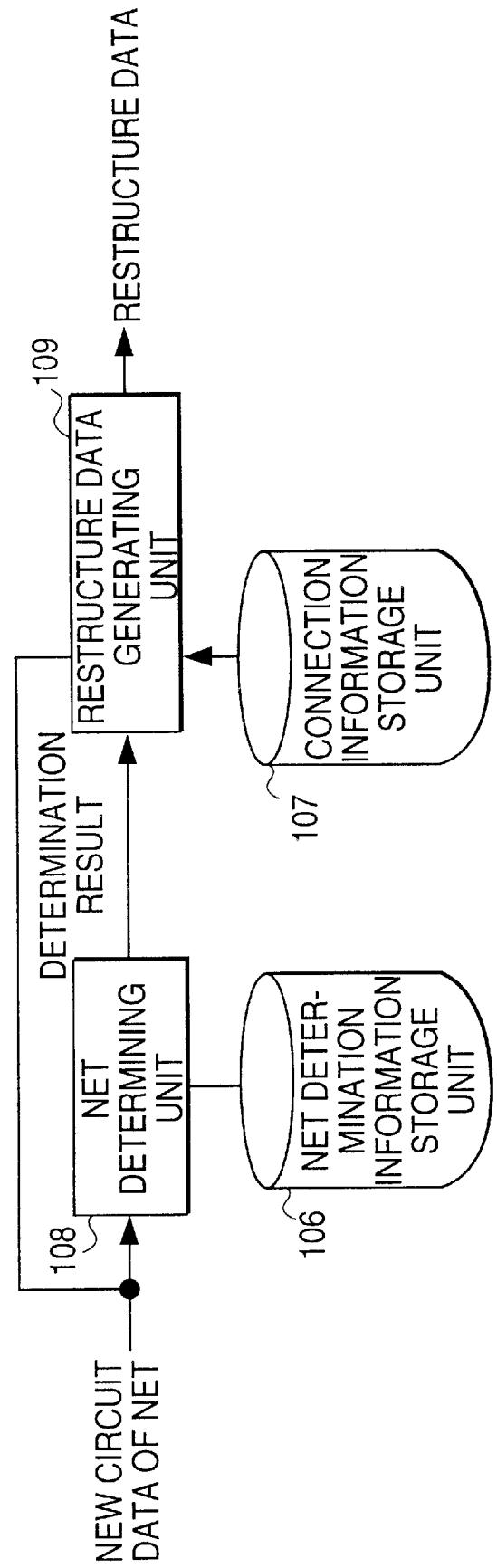
FIG. 9 shows the principle (2) of the present invention.

FIG. 9 shows the principle of another aspect of the present invention.

The restructure support device of the printed distribution frame shown in FIG. 9 is designed as follows.

A net determination information storage unit 106 stores information, from the new circuit data of a net, required to determine whether or not the present net is of a special system such as ECL nets in which the connection order of terminals is limited.

A connection condition information storage unit 107 stores the connection condition of the special-system net.

A net determining unit 108 receives new circuit data of the net and determines whether or not the net is of a special system based on the new circuit data and the net determination information stored in the net determination information storage unit 106.

A restructure data generating unit 109 generates restructure data for the net determined to be of a special system by the net determining unit 108 according to the connection condition stored in the connection condition information storage unit 107 based on the new circuit data.

Figure 10:
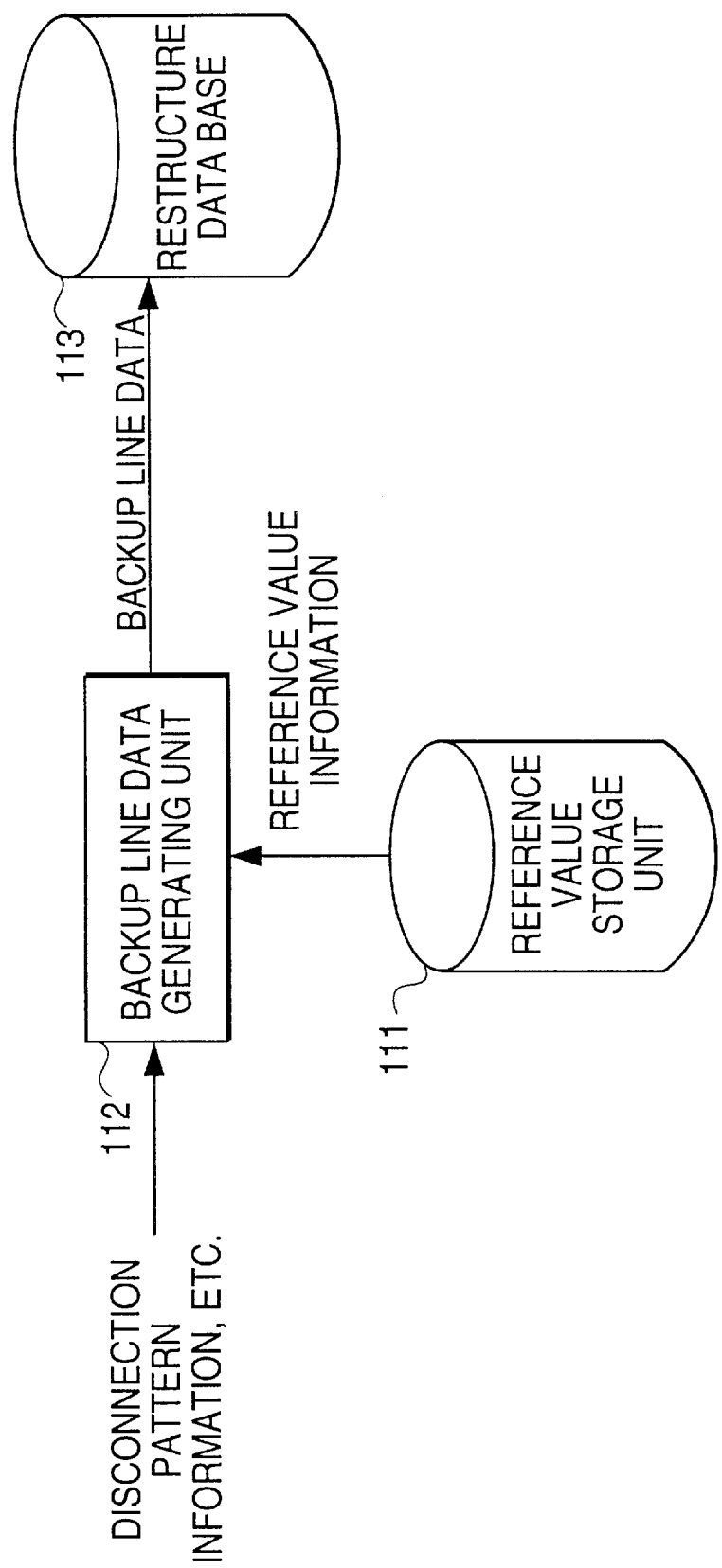
FIG. 10 shows the principle (3) of the present invention.

Next, FIG. 10 shows the principle of another aspect of the present invention.

The restructure support device of the printed distribution frame shown in FIG. 10 is designed as follows.

A reference value storage unit 111 stores a reference value of the distance between a pattern to be disconnected and its adjacent pattern when the connection is disconnected.

A backup line data generating unit 112 refers to the reference value stored in the reference value storage unit 111, detects a pattern that can be disconnected when its adjacent pattern is disconnected, and generates data to provide the pattern with a backup line.

The reference value storage unit 111 can be designed to store reference values for the patterns adjacent to the disconnected pattern on other layers to be disconnected in association with the disconnectin of the pattern.

With the above described configuration, the net backup line data generating unit 112 can be designed to store the generated backup line data such that they can be distinguished from other common connection line data in a restructure data base 113.

Furthermore, the backup line data generating unit 112 can be designed to store the backup line data such that they can be associated with object areas to be disconnected.

Figure 11:
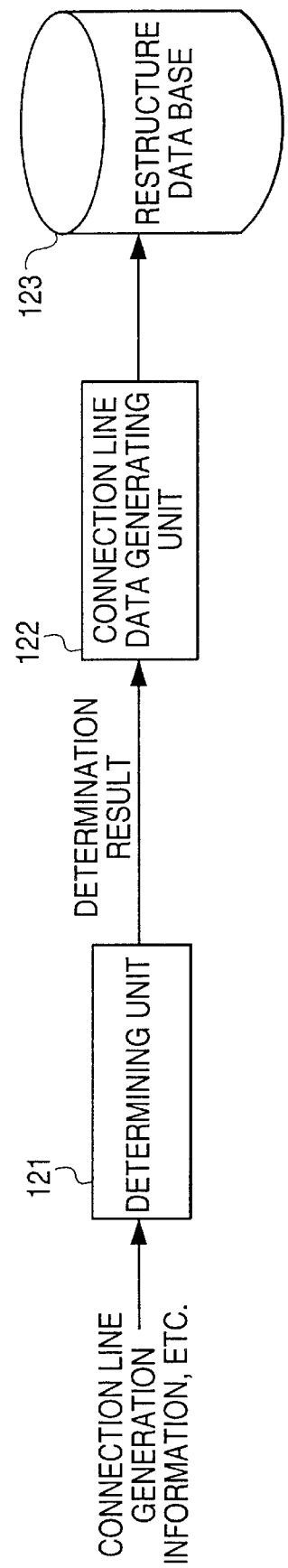
FIG. 11 shows the principle (4) of the present invention.

FIG. 11 shows the principle of another phase of the present invention.

Described below is the configuration of the restructure support device of the printed distribution frame shown in FIG. 11.

A connection line data generating unit 122 generates connection line data provided with the information indicating that a connection route should be established for the connection line determined by the determining unit 121 to require the establishment of a connection route, and enters the data in a restructure data base 123.

Figure 12:
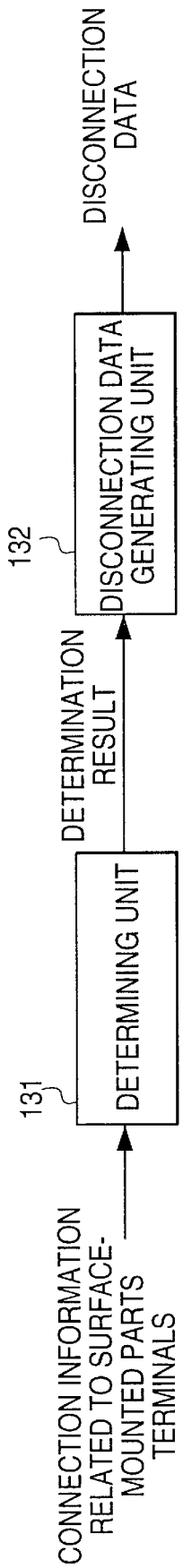
FIG. 12 shows the principle (5) of the present invention.

FIG. 12 shows the principle of another phase of the present invention.

Described below is the configuration of the restructure support device of the printed distribution frame shown in FIG. 12.

A determining unit 131 determines whether or not a leader via is provided at the terminal of a surface-mounted parts to be deleted in a new net.

A disconnection data generating unit 132 generates disconnection data for specifying the disconnection of a pattern connected to the terminal of a leader via of the surface-mounted parts determined by the determining unit 131 to be provided with the leader via.

Figure 13:
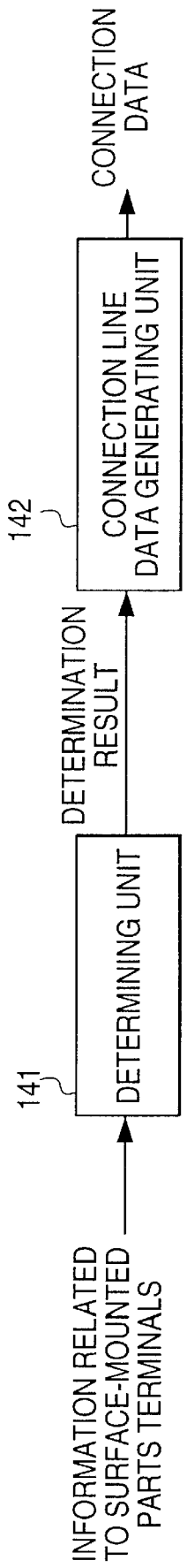
FIG. 13 shows the principle (6) of the present invention.

FIG. 13 shows the principle of another phase of the present invention.

Described below is the configuration of the restructure support device of the printed distribution frame shown in FIG. 13.

A determining unit 141 determines whether or not a leader via is provided at the terminal of a surface-mounted parts to be added in a new net.

A connection line data generating unit 142 generates connection line data for specifying the establishment of a connection line to the terminal of a leader via of the surface-mounted parts determined by the determining unit 141 to be provided with the leader via.

Figure 14:
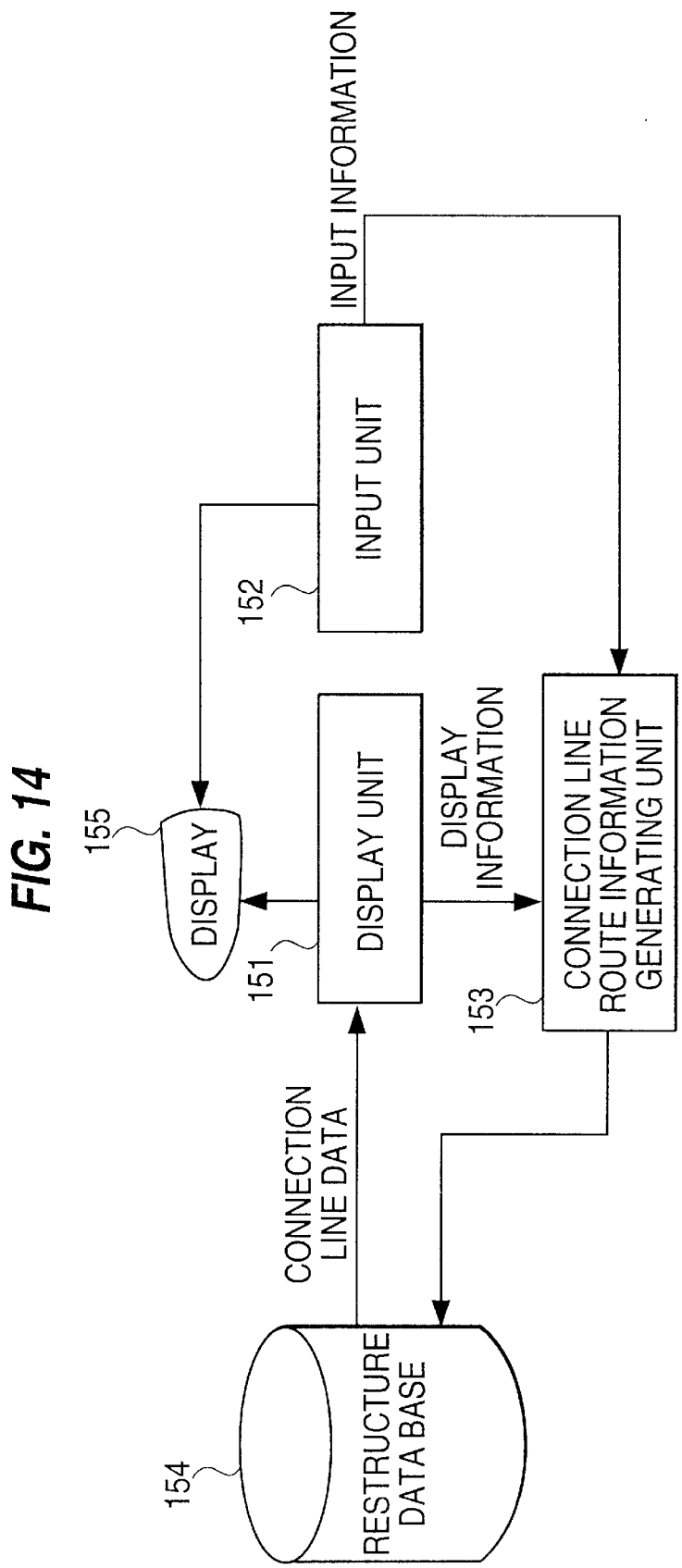
FIG. 14 shows the principle (7) of the present invention.

FIG. 14 shows the principle of another phase of the present invention.

Described below is the configuration of the restructure support device of the printed distribution frame shown in FIG. 14.

A display unit 151 reads connection line data provided with the information specifying the establishment of a connection route from the restructure data base 154 containing the restructure information of the printed distribution frame, and displays areas where connection routes are required.

An input unit 152 sets and inputs on the screen of the display unit 151 a connection route for an area where the connection route is required.

A connection line route information generating unit 153 stores in the restructure data base 154 the connection route information received from the input unit 152 as being associated with corresponding connection line data.

Figure 15:
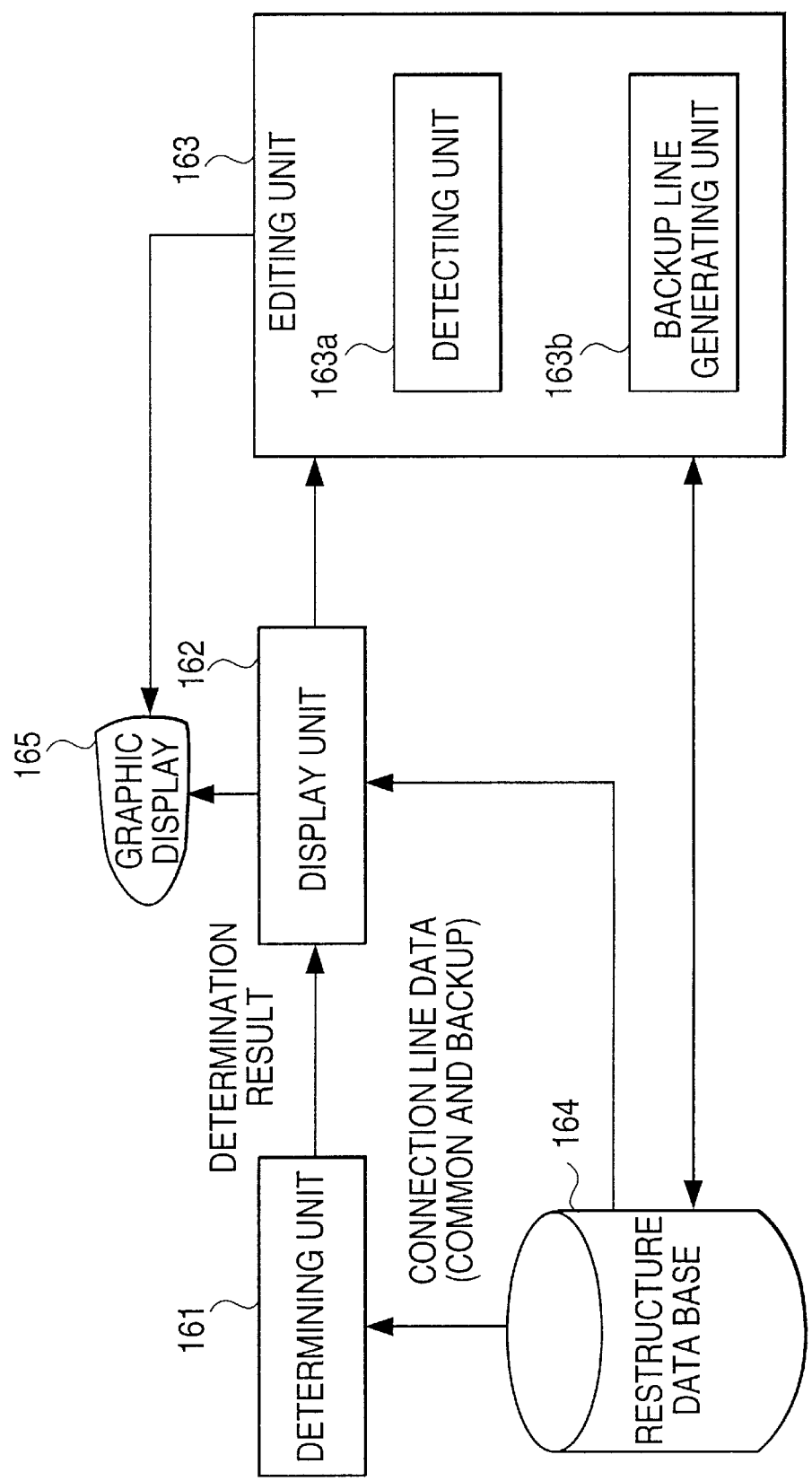
FIG. 15 shows the principle (8) of the present invention.

FIG. 15 shows the principle of another phase of the present invention.

Described below is the configuration of the restructure support device of the printed distribution frame shown in FIG. 15.

A determining unit 161 reads connection line data from a restructure data base 164 containing common and backup connection line data, and determines whether the connection line data refer to common lines or backup lines.

A display unit 162 displays the common and backup lines as being clearly distinguished from each other on the screen based on the determination result of the determining unit 161.

With the above mentioned configuration, an editing unit 163 can be added to perform a process on a connection line in response to a command entered through the screen displayed by the display unit 162.

The editing unit 163 can be designed to enter backup line data in the restructure data base 164 when a command to generate a backup line is input for a section displayed on the screen.

The editing unit 163 can be designed to display a message inquiring whether or not a backup line can be deleted when a command is input instructing the backup line to be deleted. In this case, the editing unit 163 can delete the connection line data of the backup line from the restructure data base 164 if a message is input acknowledging the deletion of the backup line in response to the inquiry.

The editing unit 163 can be designed to be equipped with a detecting unit 163*a* and a backup line generating unit 163*b*.

When a command to instruct an area within the screen displayed by the display unit 162 to be disconnected is entered, the detecting unit 163*a* detects an area which is subject to be disconnected in association with the specified disconnection.

The backup line generating unit 163*b* displays a backup line on the screen for the area detected by the detecting unit 163*a*.

The backup line generating unit 163*b* can be designed to display a message inquiring whether or not the displayed backup line can be entered. If an acknowledgement of the entry of the backup line is entered in response to the message, the backup line generating unit 163*b* can enter the connection line data of the backup line in the restructure data base 164.

The operation performed according to the principle of the present invention is described below by referring to the configuration shown in FIG. 8.

According the present invention, when the net determining unit 103 receives new circuit data of a net, it retrieves the net determination information storage unit 101 according to the parts specification information of an output terminal, etc. and checks whether or not the output terminal outputs a signal of an output level whose connection order is defined as, for example, an ECL level. If yes, the net is determined to be of a special system.

The restructure data generating unit 104 receives circuit data of an old version (old circuit data) and circuit data of the latest version (new circuit data) of the net determined to be of a special system. Then, it extracts terminals (pins) to be deleted and added when a new circuit is structured after obtaining a logical difference between these data. After disconnecting the terminal to be deleted, the terminals used in the old circuit and also used in the new circuit are connected to the terminals to be added on a printed distribution frame according to the connection order information stored in the connection information storage unit 102 in order to generate restructure data (connection data and connection line data) obtained as a result of these processes.

Thus, the connection order of the terminals has been manually determined in the conventional method for the restructure data, and can be automatically determined according to the present invention.

The connection condition information storage unit 105 can be provided to store the connection condition information such as the limited length of an antenna required when an ECL-system net is restructured, the length of connection lines for double connection lines, and the retrieval range of earth lands to be provided with double connection lines. With this unit, the restructure data generating unit 104 generates as a part of the restructure data disconnection data for use in disconnecting antennas and connection line data for use in establishing double connection lines.

Thus, automatically restructured is an ECL-system net of high quality.

The operation performed according to the principle of the present invention is described below by referring to the configuration shown in FIG. 9.

According to the present invention, the net determining unit 108 determines by referring to the information stored in the net determination information storage unit 106, as in the net determining unit 103 shown in FIG. 8, whether or not an input net is of a special system.

The restructure data generating unit 109 reads from the connection condition information storage unit 107 the connection condition also defined for the output terminal in the new circuit data, and generates the restructure data (disconnection data and connection line data) for use in altering the connection condition of the special-system net to meet the specified connection condition.

Thus, for example, an automatic restructure can be performed even when the circuit connection information is not changed between a new circuit and an old circuit but the connection condition related to the net is changed. It is obvious that a net can be automatically restructured according to the connection condition where the circuit connection information is changed.

If the connection condition information storage unit 107 stores the limited value of the branch length as a connection condition to allow the branch connection from a master route in an ECL-system net, then the restructure data generating unit 109 detects an area where a new technology indicates a branch length error, and generate restructure data to remove the error.

Thus, the automatic restructure can be carried out in a wide range in relation to the connection condition of an ECL-system net.

The operation performed according to the principle of the present invention is described below by referring to the configuration shown in FIG. 10.

According to the present invention, the backup line data generating unit 112 calculates the distance between a disconnected pattern and the adjacent pattern according to the disconnection point of the disconnected pattern and the position information of the adjacent pattern, compares the distance with the reference value stored in the reference value storage unit 111, and determines whether or not the adjacent pattern is also disconnected. Then, it generates backup line generation data so that a backup line can be established for the adjacent pattern which can be incidentally disconnected.

Backup lines have been manually generated in the conventional methods, but can be automatically generated according to the present invention. In addition to the reference value of a layer whose pattern is disconnected, automatically assigned is a reference value for a layer which can be incidentally drilled when the disconnection is made. As a result, the backup line data can be automatically generated on a multilayer printed distribution frame for all layers where object pattern exist. Furthermore, the backup line data are stored in the restructure data base 113 as associated with the connection areas where backup lines are established, or as being distinguished from the general line data so that the subsequent automatic restructure can be efficiently and quickly performed.

The operation performed according to the principle of the present invention is described below by referring to the configuration shown in FIG. 11.

According to the present invention, the determining unit 121 determines a connection line to be specified by the designer for a land equipped with terminals of surface-mounted parts where the terminals are mounted closely.

In response to the determination result, the connection line data generating unit 122 generates connection line data which specify with, for example, a mark, the establishment of a special route for a connection line determined to be assigned a connection route, and then enter the data in the restructure data base 123.

If a connection line is provided by an automatic line connection device and is assigned a connection route, connection line data are generated to inform of the establishment of the connection route. The connection line data are entered in the restructure data base 123.

The operation performed according to the principle of the present invention is described below by referring to the configuration shown in FIG. 12.

According to the present invention, the determining unit 131 determines whether or not a terminal of a surface-mounted parts is provided with a leader via when a connection line of the terminal is disconnected.

In response to the determination result, the disconnection data generating unit 132 generates disconnection data for use in disconnecting a pattern which connects the leader via to lands, etc. other than the above described surface-mounted parts terminal as the disconnection data of the terminal of the surface-mounted parts.

Thus, processing as a virtual pin a leader via connected to the terminal of a surface-mounted parts enables a pattern connecting the existing terminal of the surface-mounted parts to the leader via to be effectively utilized. That is, since the pattern is not disconnected by the disconnection of the terminal of the surface-mounted parts, the terminal of the surface-mounted parts does not have to be provided with a connection line in the subsequent restructure process. Instead, a connection line should be provided for the virtual pin. Therefore, a thermal stress generated in a soldering process can be prevented from being applied to the terminal of the surface-mounted parts.

The operation performed according to the principle of the present invention is described below by referring to the configuration shown in FIG. 13.

According to the present invention, the determining unit 141 determines whether or not a leader via is connected to the terminal of the surface-mounted parts when a connection line is required for the terminal of the surface-mounted parts. The connection line data generating unit 142 generates connection line data for use in establishing a connection line for the leader via if the terminal of the surface-mounted parts is determined by the determining unit 141 as being connected to a leader via.

Thus, the leader via of a terminal of the surface-mounted parts is processed as a virtual pin and the connection line of the terminal of the surface-mounted parts is established for the leader via. Therefore, a thermal stress generated in a soldering process can be prevented from being applied to the terminal of the surface-mounted parts.

The operation performed according to the principle of the present invention is described below by referring to the configuration shown in FIG. 14.

According to the present invention, the display unit 151 reads the connection line data from the restructure data base 154 and extracts from them the connection line data containing the information specifying the establishment of a connection route. Then, a display 155 displays the area to be provided with a connection line together with the connection line established there.

The designer inputs and sets a required connection route on the screen through the input unit 152 for the area where the connection line is required as indicated by the display unit 151 on the display 155.

The connection line route information generating unit 153 enters connection route information entered and set by the designer in the restructure data base 154 with the information linked with corresponding connection line data.

Thus, a connection route can be easily set in a conversational mode on the screen. The route can be also easily managed because the connection route information can be entered in the restructure data base 154 as being linked with the corresponding connection line data.

The operation performed according to the principle of the present invention is described below by referring to the configuration shown in FIG. 15.

According to the present invention, the determining unit 161 reads from the restructure data base 164 the connection line data of the connection line established for the specified area of the printed distribution frame, and determines whether the connection line data refer to common lines or backup lines.

Based on the data, the display unit 162 receives the determination result and displays the line connection state at the specified area on a graphic display 165 of, for example, a work station. The data are displayed as clearly distinguishing common lines from backup lines.

Thus, the designer can recognize on the screen the backup lines from the common lines and confirm the state of the connection lines at a desired area on the printed distribution frame.

If a command is entered in association with the connection line displayed on the screen of the graphic display 165 in the above described display state, then the editing unit 163 performs a process specified by the command on the connection line. If a command is entered to generate a connection line for an optional area displayed on the screen, then backup line data are entered in the restructure data base 164. If a command is entered to delete the backup line being displayed, then output is a message inquiring whether or not the backup line can be deleted. If the designer acknowledges the delete message, the backup line data are deleted from the restructure data base 164.

As described above, the common lines and backup lines are automatically displayed on the screen and edited optionally by the designer in an conversational mode. Furthermore, a backup line can be easily generated for an optional area.

Then, the detecting unit 163a detects an area where a pattern can be incidentally disconnected when another pattern being displayed on the screen is disconnected. Then, the backup line generating unit 163b generates a backup line for the detected area and displays it on the screen of the graphic display 165.

Thus, if a pattern is disconnected on the screen, then it is automatically checked whether or not a backup line should be provided, and a necessary backup line is displayed on the screen. The designer is allowed to be devoted to the disconnection of patterns.

The backup line generating unit 163b displays a message inquiring whether or not the backup line can be entered in the restructure data base 164 when the backup line is displayed. If an acknowledgement is returned in response to the message, the connection line data of the backup line are entered in the restructure data base 164.

Thus, the designer can select whether or not the automatically generated backup line should be entered in the restructure data base 164.

An embodiment of the present invention is described below by referring to the attached drawings.

Figure 16:
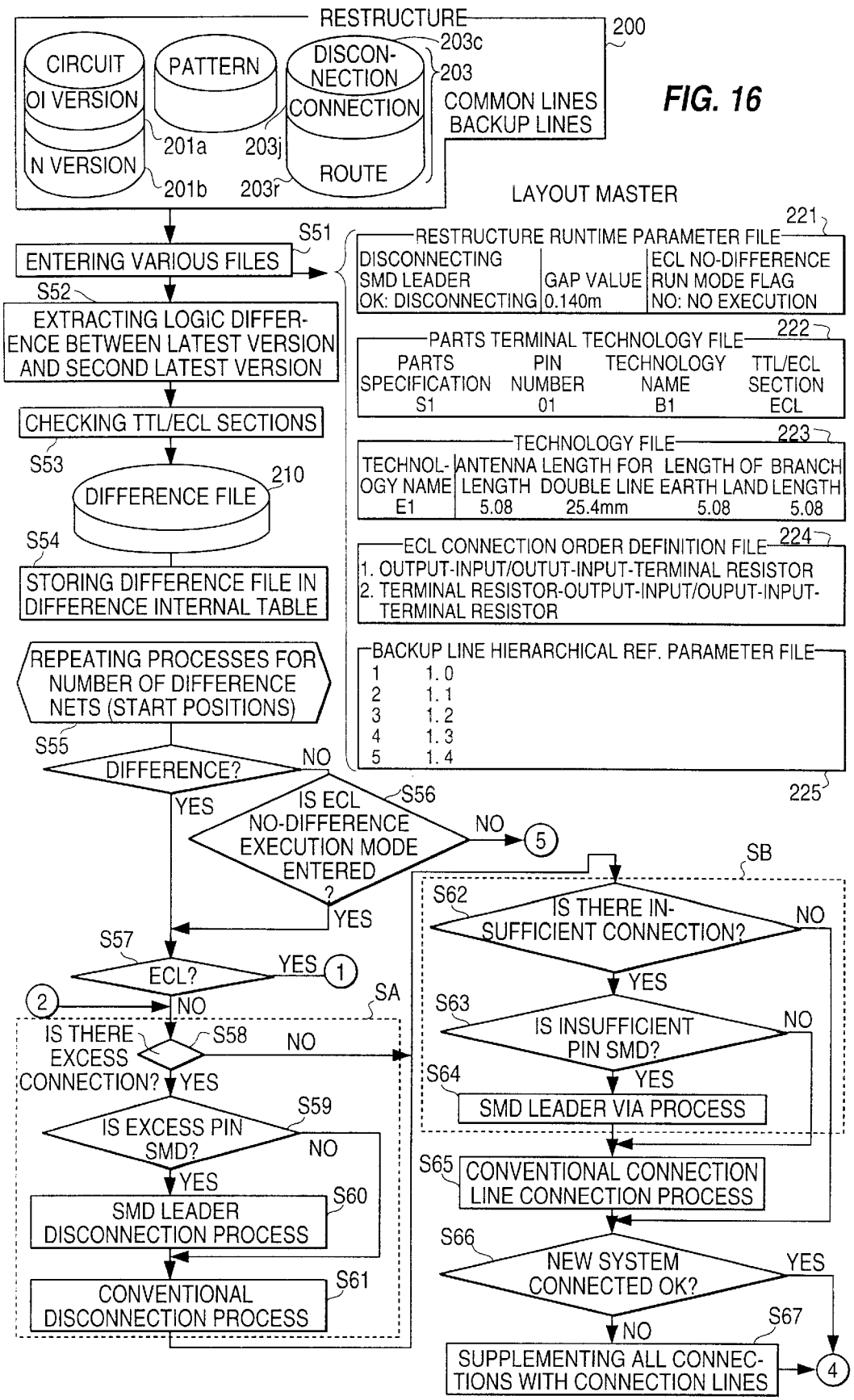
FIG. 16 is a flowchart (1) showing the automatic restructure process according to an embodiment of the present invention.
Figure 17:
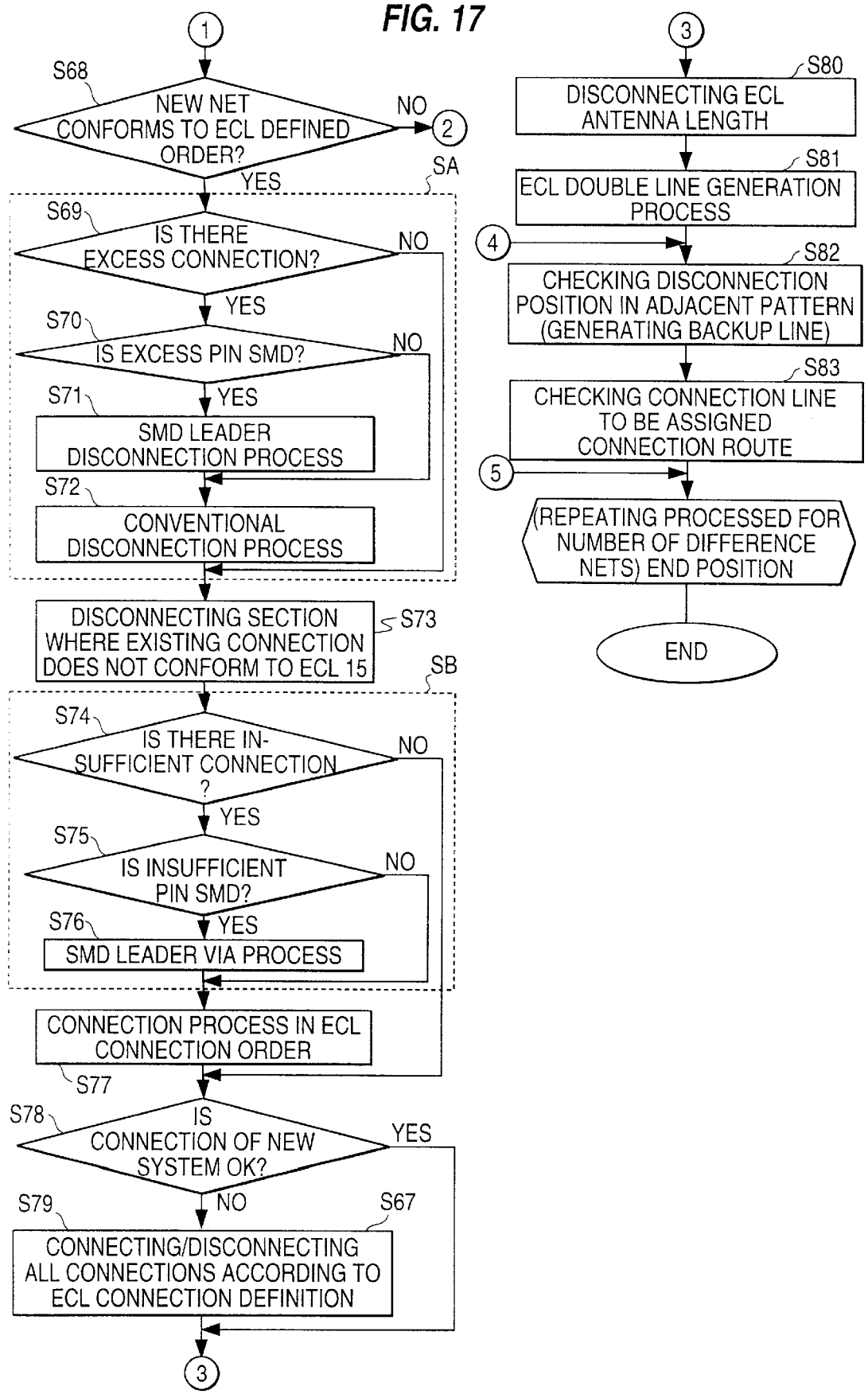
FIG. 17 is a flowchart (2) showing the automatic restructure process according to an embodiment of the present invention.

FIGS. 16 and 17 are flowcharts showing the procedure of the automatic restructure tool according to the present embodiment where a printed distribution frame is restructured.

A surface-mounting data base 200 comprises a circuit chart data file 201b storing circuit chart data for each version, a first pattern data file 201a storing data of the arrangement of a pattern on the printed distribution frame, and a restructure data base 203.

The restructure data base 203 according to the present embodiment comprises a disconnection information file 203c, a connection line information file 203j, and a connection line route information file 203r. The connection line information file 203j stores information about all connection lines provided for the printed distribution frame, and the information contains common lines and backup lines as being distinguished from one another. A common line refers to a normal connection line, while a backup line refers to a connection line provided to backup a line which is subject to be disconnected when another line is disconnected.

The connection line route information file 203r stores connection route information required when an automatic line connection device establishes a connection line pattern closely to the printed distribution frame.

The automatic restructure tool according to the present embodiment receives a restructure runtime parameter file 221, a parts terminal technology file 222, a technology file 223, an ECL connection order definition file 224, and a backup line hierarchical reference parameter file 225 (S51).

Described below are the contents of the files shown in FIG. 16.

The restructure runtime parameter file 221 stores various parameters for defining the conditions for the operation of an automatic restructure tool. The SMD leader disconnection parameter specifies whether or not a leader via should be a virtual pin. If it indicates OK, the leader via is processed to be used as a virtual pin. A gap value parameter specifies a gap value used in a general disconnection process and a backup line generation process.

An ECL no-difference run mode flag is used to set an ECL no-difference run mode in which an ECL-system new net yielding no logical difference is restructured. The run mode is not set if NG is set as shown in FIG. 9. In this case, an ECL-system net as well as a TTL-system net is automatically restructured only if the net yields a logical difference. If the ECL no-difference run mode flag is set to OK, then the ECL no-difference run mode is set and all new ECL-system nets are automatically restructured regardless of the existence of logical difference.

The parts terminal technology file 222 stores information (parts specification, pin number, technology name, TTL/ECL system) of a terminal (pin) of respective parts. A technology name refers to a name assigned to a design rule applied when a TTL- or ECL- system net is mounted onto a printed distribution frame, and is used as an index key to the technology file 223 explained later.

The technology file 223 stores a mounting design rule for each technology and stores four variations of connection conditions (length of antenna, length for double lines, length of earth land, and length for branch) as design rules in an ECL-system net restructure process.

As described above, terminals of the ECL-system net are connected in a series, but can be branched if the length of a branch is in a predetermined range. Therefore, a master route in the ECL-system net can be defined as follows.

A master route is established between a start land and an end land. The start land, end land, and master route are set as follows depending on whether they exist as a single unit or plural units. In the following examples, the ECL net is represented as On-Cn-In (n indicates a natural number). The On and In indicate an output terminal and an input terminal respectively.

Figure 1:
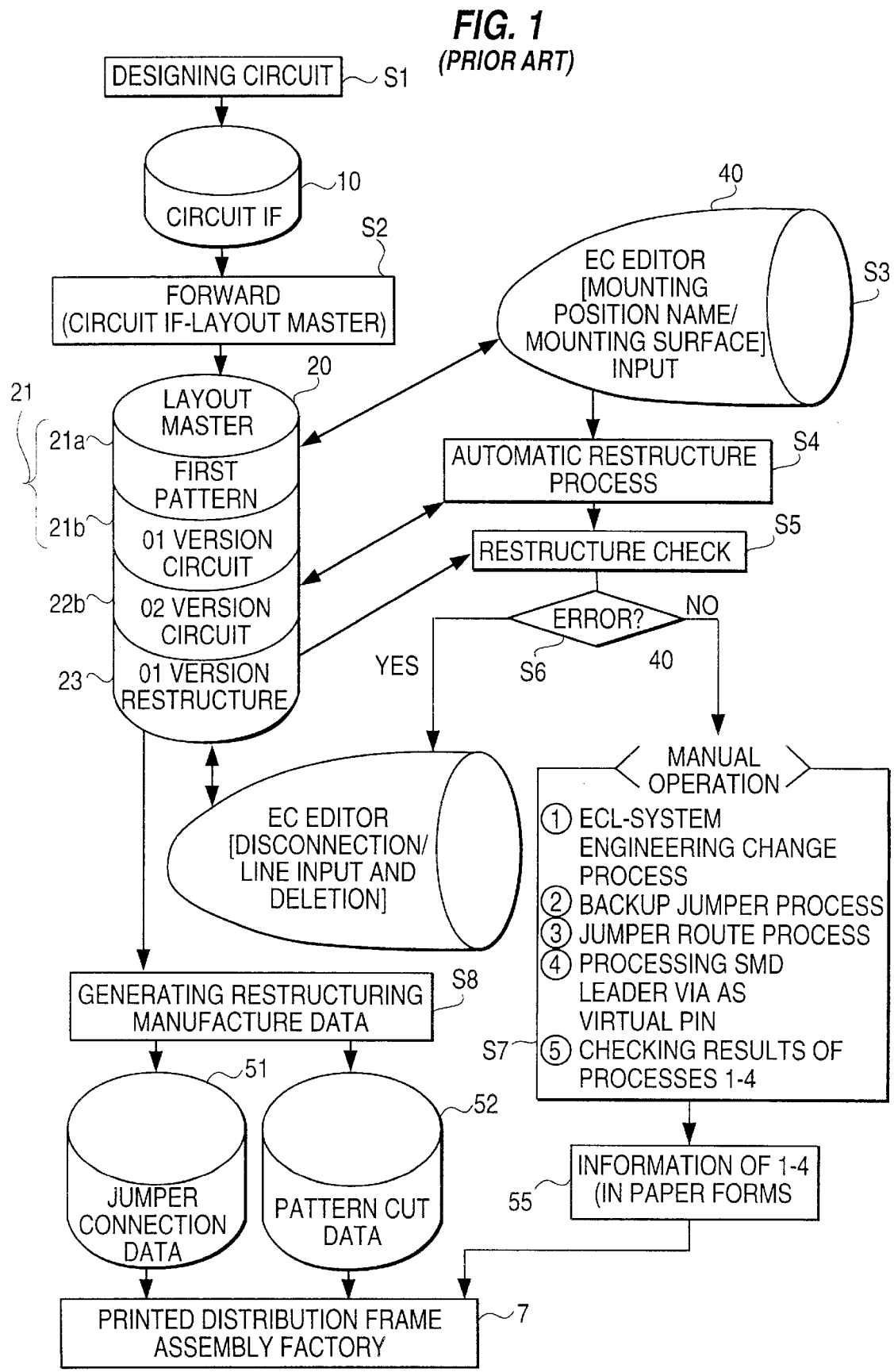
FIG. 1 shows the procedure of restructuring a conventional printed distribution frame.
Figure 2:
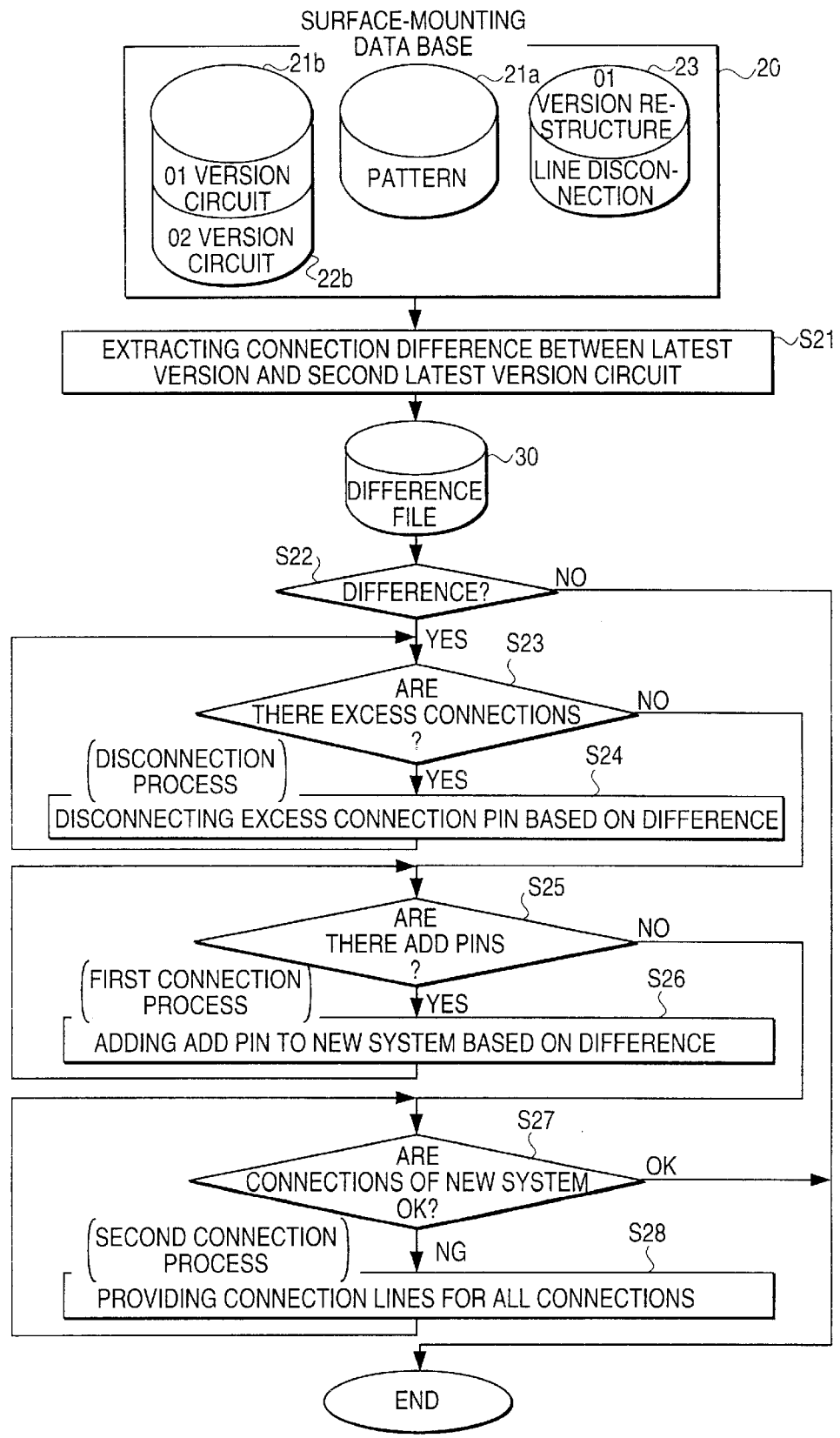
FIG. 2 is a flowchart showing a conventional automatic restructure process.
Figure 4A:
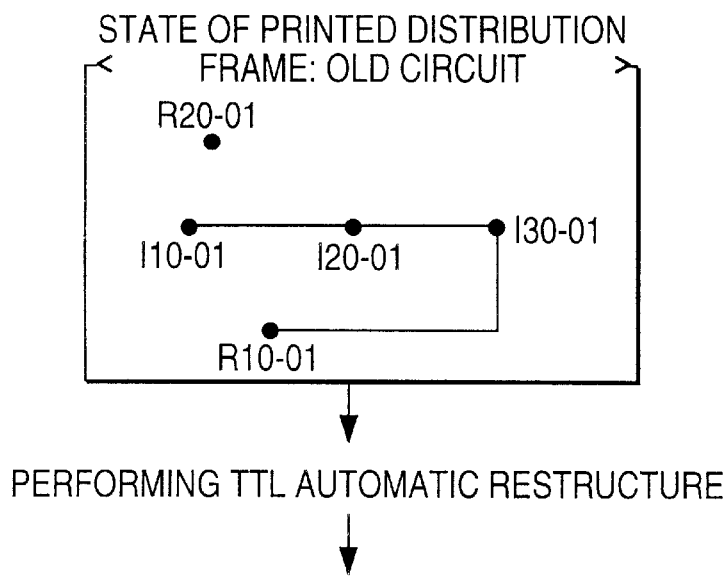
FIGS. 4A, 4B, and 4C illustrate the problem in the restructure of an ECL net in the conventional automatic restructure process.
Figure 4B:
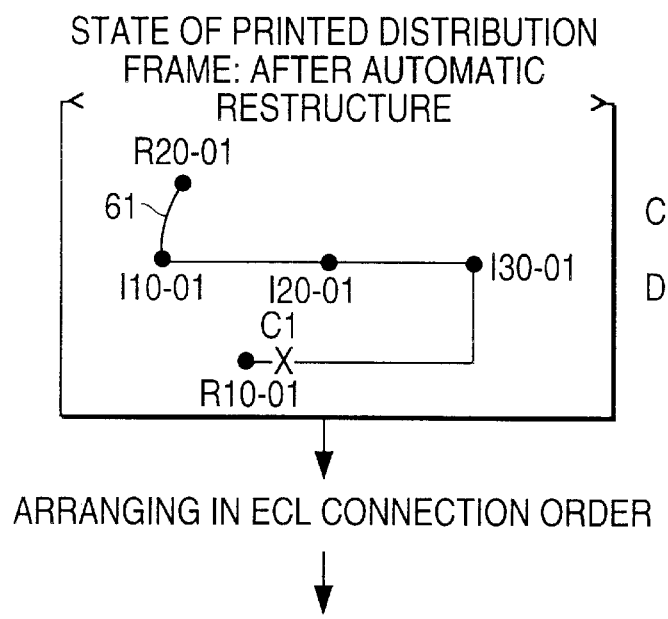
Figure 4C:
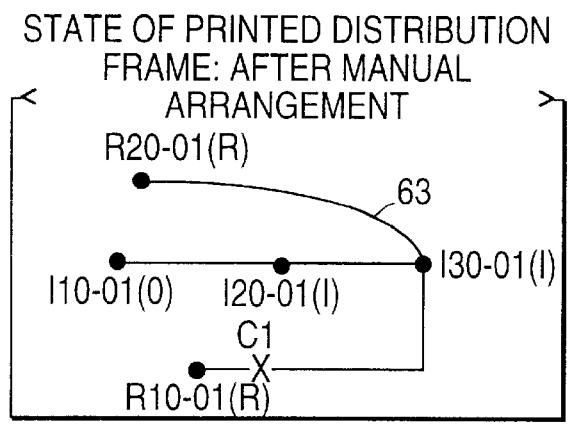
Figure 5:
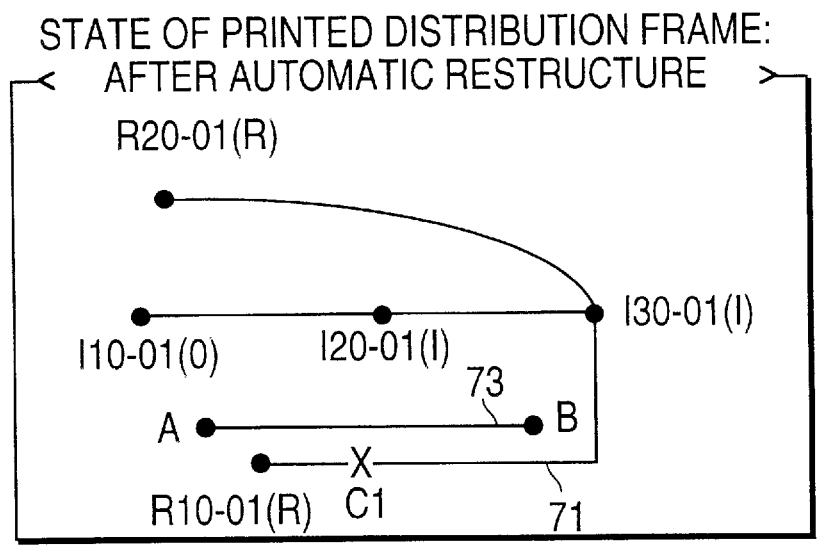
FIG. 5, shows the method of generating the conventional backup line.
Figure 6:
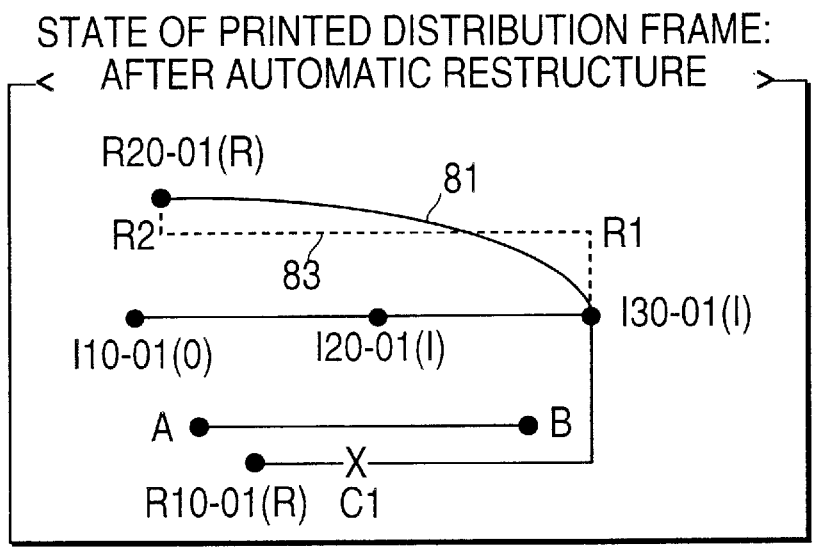
FIG. 6 shows the problem related to the establishment of the conventional connection route.
Figure 7A:
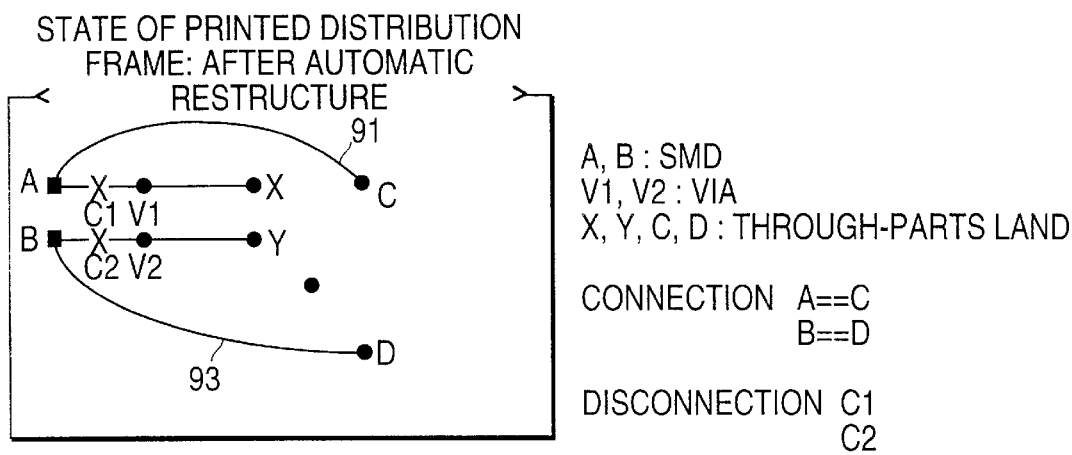
FIGS. 7A and 7B show the problem in the conventional process of disconnecting SMD terminals and in the process of connecting SMD terminals.
Figure 7B:
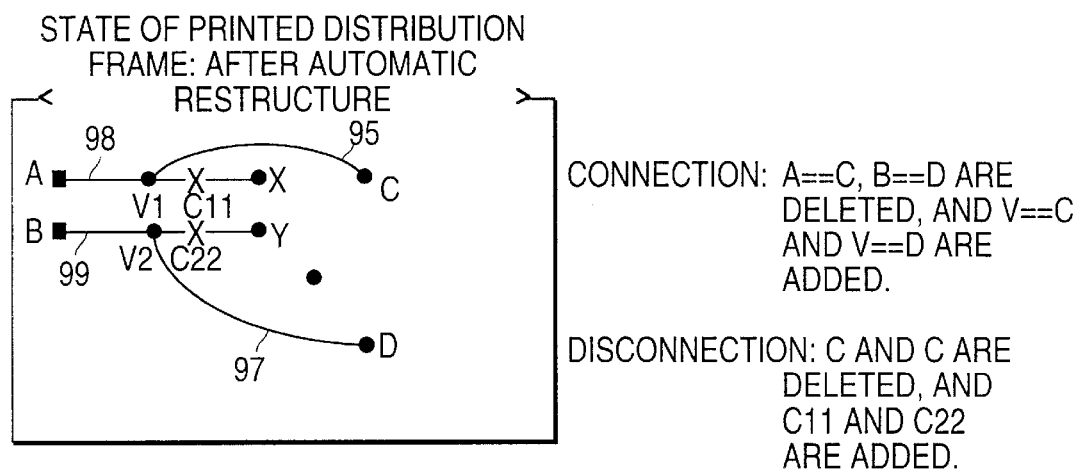

(a) If there are a single start land and a single end land as shown in FIG. 18A, then they are defined as the start land and the end land in the net, and the master route is established between the start land 01 and the end land I1.
(b) If there are plural start lands and a single end land as shown in FIG. 18B, then the start land connected with the longest line to the end land is defined as the start land of the master route of the net. Therefore, in the example shown in FIG. 18B, 02 is the start land and 02-C1-C2-I1 is the master route. By contrast, if there are a plurality of end lands, then the end land connected with the longest line to the single start land is defined as the end land of the master route of the net.
(c) If there are a plurality of start lands and end lands as shown in FIG. 18C, then the start land and the end land connected with the longest connection line is defined as the start land and the end land of the master route of the net. Therefore, 02-C1-I1-I4 is the master route land in the example shown in FIG. 18C.

An antenna is defined as follows.

The antenna is generated when an ECL-system net is restructured.

Figure 19:
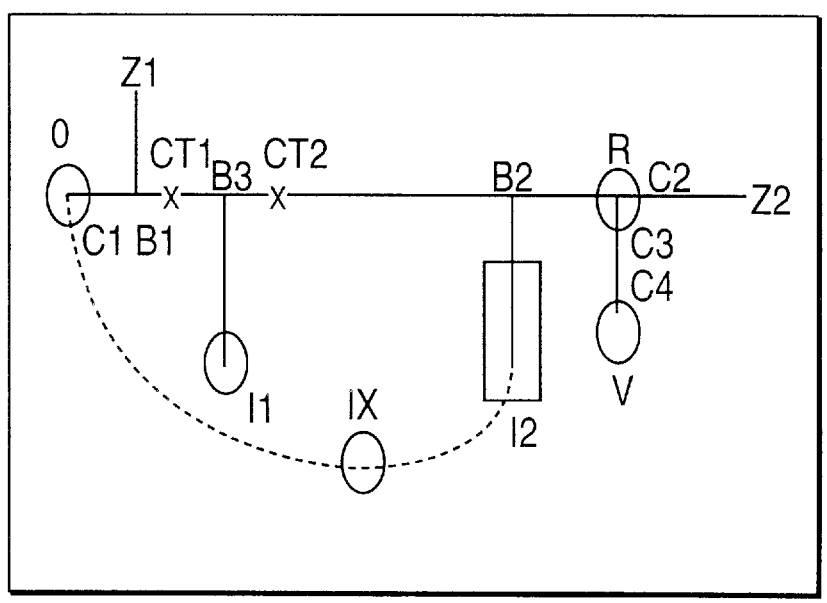
FIG. 19 shows the method of defining an antenna used for the ECL-system net.

For example, in the ECL-system net 0-I1-I2-R where O-R is the master route, and B3-I1 and B2-I2 are branches as shown in FIG. 19, disconnections CT1 and CT2 are made between B1 and B3 and between B3 and B2 respectively. Then, connections are made between 0 and IX and between IX and I2 to generate a new ECL-system net 0-I1-I2-R. In this case, the master route of the new net is 0-IX-I2-B2-R, and antennas are set for the following four areas.

1. C1-B1-Z1
2. B2-CT2
3. C2-Z2
4. C3-C4

That is, antennas are provided for the areas not included in the master route but connected to the master route (connection pattern). These antennas carry noises on signals when the length of the antennas exceeds a predetermined value and the signals are turned at the end of the antennas during the transmission through the connection lines. Since the noises affect the circuit badly, the antennas must be disconnected. The length of the antennas is predetermined for the disconnection as set in the technology file 223.

If a new connection line is provided in a restructure process of an ECL-system net and the length of the line exceeds a predetermined value (referred to as the length for double connection lines), then it may cause a noise and therefore requires another line forming double lines which are used in a pair. In this case, the double lines are established between earth lands of a digital system. The earth lands are retrieved within the range of a circle having the radius R from the land to which the connection line is connected. The radius R is referred to as the length of the earth land. The length for double lines and the length of an earth land are set in the technology file 223.

The technology file 223 stores the length of a branch set to limit the length of a multipoint connection to the above described master route. That is, the maximum length of a multipoint connection is 5.08 mm in FIG. 16, and a multipoint connection spanning over 5.08 mm is referred to as an error.

Thus, the technology file 223 stores the length of antennas, length for double lines, length of earth lands, and branch length for each technology name of an ECL-system net.

The ECL connection order definition file 224 stores the definition information of the connection order to be followed in connecting an ECL-system net.

The following connection order is defined in the ECL connection order definition file 224 shown in FIG. 16.

1. output - input/output - input - terminal resistor
2. terminal resistor - output - input/output - input - terminal resistor A reference value for use in determining whether or not a backup line should be generated in disconnecting a connection pattern is stored in the backup line hierarchical reference parameter file 225. The backup line hierarchical reference parameter file 225 shown in FIG. 16 is an example of a 5-layer printed distribution frame. Each of the five layers can be disconnected. Normally, a drill is used to disconnect the layers. If a pattern on a layer other than the surface layer is disconnected, the layers are processed with the drill from the surface to an object layer. Therefore, even if the smallest possible hole is made in the object layer, larger holes can be made at the corresponding points in the upper layers.

According to the present embodiment, assumed is a circle of a radius R (radius of gap value) with the disconnection point set at the center. The area enclosed by the circle is defined as a gap area. A backup line is generated for a connection pattern which originally should not be disconnected in the gap area. Then, obtained are gap areas for all layers processed by the drill. The radius of gap areas equals a value obtained by multiplying the radius R of gap value of the object layer by a predetermined coefficient. That is, assuming that the coefficient of the adjacent layer is 1.1 and sequentially incremented by 0.1 for each lower layer, the coefficient for the layer n layers apart from the disconnected layer to the surface layer is 1.0+0.1 n. Thus obtained coefficients 1.1, 1.2, 1.3, and 1.4 are stored in the backup line hierarchical reference parameter file 225 as shown in FIG. 16. The numbers 1~5 added to the left of each of the coefficients indicate the number of layers from the layer to be disconnected. In this example, the layer to be disconnected is 1 (the coefficient is 1.0). 2 and the subsequent numbers correspond to the layer toward the surface other than the layer to be disconnected.

Described again are the flowcharts shown in FIGS. 16 and 17.

After the entries of various files in step S51, the latest circuit data (new circuit data) and the second latest circuit data (old circuit data) are read from the surface-mounting data base 200, and the logical difference between these circuit data is extracted (S52).

Then, the net of the new circuit data for which the logical difference has been extracted is classified into a TTL-system net or an ECL-system net using the parts specification and the pin number of the output pin as keys by referring to the parts terminal technology file 222. At this time, the technology name is added to the logical difference extraction data, and the net number is set for link with the new circuit data. These data are stored in a difference file 210. In this case, only the logical difference extraction data yielding a difference are stored in the TTL-system net, while the logical difference extraction data for all nets are stored in the ECL-system net regardless of the existence of a difference (S53).

Then, the contents of the difference file 210 are loaded onto the difference internal table provided in the main memory (S54). The processes in steps S55~S57 are performed for all nets by referring to the logical difference extraction data.

That is, the logical difference extraction data in the nets are read in the order of net numbers, and then it is determined whether or not the logical difference extraction data contains difference information (about add pins and delete pins) (S55). For the net yielding difference information, a new technology name of the net is read from the logical difference extraction data, and the parts terminal technology file 222 is retrieved using the new technology name as a key to determine whether the net refers to a TTL system or an ECL system (S57).

If no difference information is output in step S55, the ECL no-difference run mode flag in the restructure runtime parameter file 221 is checked whether it is set to NG or OK (S56). If it is set to OK, that is, the ECL no-difference run mode is entered (yes in S56), then control is passed to the determination process in S57. If the flag is set to NG, that is, the ECL no-difference run mode is not entered, then control is transferred from the difference internal table to the process of reading logical difference extraction data in the next net.

If it is determined in step S57 that the net is of a TTL system (no in S57), then it is determined whether or not an excess connection exists by referring to the logical difference extraction data (S58). If there is any excess connection (yes in S58), then an excess pin to be deleted is checked by referring to the parts information in the first pattern data whether or not it contains an SMD pin (terminal) (S59).

If an SMD terminal is detected in the pin to be deleted (yes in S59), then a virtual pin process is performed such that the leader via connected to the SMD is processed virtually as the SMD terminal. Thus, the SMD leader is disconnected by disconnecting another connection pattern connected to the virtual pin (S60) instead of disconnecting the pattern which connects the SMD terminal to the leader via. This process is explained later in detail.

Then, a normal and conventional disconnection process is performed for delete pins other than the SMD terminal (S61). If it is determined in step S59 that no SMD terminals are detected in the delete pin (no in S59), then control is immediately transferred to step S61 and the normal disconnection process is performed on the delete pin.

Thus, in the automatic restructure process according to the present embodiment, a connection pattern is disconnected by processing an effective leader via as a virtual pin when the SMD terminal exists as a delete pin in the TTL-system net.

After disconnecting the pattern to delete the above described excess connection, or if no excess connections are detected in step S58 (no in S58), then it is determined whether or not there is a pin in need of connection by referring to the logical difference extraction data (S62). If yes (yes in S62), it is determined whether or not the pin in need of connection, that is, an add pin, is the terminal of the SMD (S63). If it is an SMD terminal (yes in S63), then the leader via connected to the SMD terminal is processed as a virtual pin as in the above described disconnection process, and an SMD leader via process is performed such that a connection line is provided for the virtual pin (S64). This process is explained later in detail.

Then, the normal line connection process is performed on a pin to be connected other than an SMD terminal (S65). If it is determined that no SMD terminals are detected in the pin to be connected in step S63 (no in S63), then control is immediately transferred to step S65 and the line connection process is performed on the pin.

Thus, when the add pin is an SMD terminal in the present embodiment, the leader via is processed as a virtual pin to perform an effective line connection process on the SMD terminal as described later.

After the line connection processed is performed on the add pin, or if it is determined in step S62 that an additional connection is not necessary (no in S62), then it is determined whether or not the new net is correctly connected, that is, whether or not there is a point not to be connected (S66). If any point is not to be connected (no in S66), then the point is connected with a line (S67).

Then, it is determined whether or not there is a pattern which is adjacent to another pattern to be disconnected and may be incidentally disconnected. If yes, the pattern is provided with a backup line (S82). The disconnection check of the pattern adjacent to the disconnected pattern is made based on a gap value stored in the restructure runtime parameter file 221 and a coefficient stored in the backup line hierarchical reference parameter file 225. An area where a backup line is required is marked in the connection line data of the area in the connection line information file 203j of the restructure data base 203. The backup line generation process S82 is explained later in detail.

Then it is determined whether or not there is a connection line connecting a land where SMD terminals are connected more closely than predetermined intervals (for example, 0.5 mm). If yes, the connection line should be indicated with a route request mark added to the connection line data in the connection line information file 203*j* of the restructure data base 203 (S83). The connection line is provided by an automatic line connection device closely onto a printed distribution frame. The connection route is determined by the designer using a restructure editor in an conversational mode. A series of the processes are explained later in detail.

If the new net is correctly connected (yes in S66), then the processes in steps S82 and S83 are performed immediately.

If it is determined in step S57 that the new net is of an ECL system (yes in S57), then the new circuit data of the net is read from the circuit chart data file 201*b* of the restructure data base 203 according to the net number stored in the logical difference extraction data of the net. Then, the connection order defined in the new circuit data is compared with the ECL connection order defined in the ECL connection order definition file 224, and it is determined whether or not the new net conforms to the definition of the ECL connection order (S68).

If the new net of an ECL system does not conform to the definition of the ECL connection order (no in S68), then the new net is regarded as a TTL-system net, and the processes in S58~S67, S82, and S83 are performed on the net. During the processes, warning messages are output on the display and printer.

If the new net conforms to the definition of the ECL connection order in step S68 (yes in S68), then the processes in steps S69~S72 are performed in relation to the excess connection as in the case of the above described new TTL-system net. A series of processes SA in step S69~S72 are the same as the processes in steps S58~S61 in the above described new TTL-system net, and therefore the detailed explanation of the processes are omitted here. Thus, if an SMD terminal exists as a delete pin in a new ECL-system net, then the leader via is processed as a virtual pin and another connection pattern connected to the virtual pin is disconnected instead of the disconnection between the SMD terminal and the leader via.

Then, an old connection pattern after the disconnection process is checked, and the area not conforming to the definition of the ECL connection order is disconnected (S73).

As in the above described TTL-system net, the SMD leader via process is performed when the pin to be connected is an SMD terminal (S74~S76). A series of processes in steps S74~S76 are the same as the processes SB in steps S62~S64. After processing the leader via of the SMD terminal as a virtual pin in the processes SB and the leader via is connected, a connection line conforming to the definition of the ECL connection order is provided for other add pins (S77).

If it is determined in step S74 that no add pins are detected (no in S74), then it is checked whether or not the new net conforms to the definition of the ECL connection in consideration of the branch length stored in the technology file 223 (S78). If it does not conform to the definition (no in S78), then a connection line is provided or an existing connection is disconnected such that all connections of the new net conform to the definition of the ECL connection order and the branch length (S79).

Then, using as a key the name of the technology where the logical difference extraction data are defined, the technology information (length of antennas, length for double connection lines, and length of earth lands) having the name of the technology is read from the technology file 223. Then, as described above, the ECL antenna length disconnection process (S80) is performed to disconnect a noise-generating part of the antenna, and the ECL double connection line generation process (S81) is performed to reduce noises (S81). If the new net conforms to the definition of the ECL connection (yes in step S78), then performed immediately are the ECL antenna length disconnection process S80 and the EXC double connection line generation process S81.

Then performed as in the case of the new TTL-system net are the backup line generation process in step S82 and the connection route generation necessity check in step S83.

The processes in steps S57~S83 are performed on all nets restructured and stored in the difference internal table.

According to the above described flowchart, a no-logical-difference ECL-system net can be automatically restructured. That is, if the new net is of an ECL system, then it requires a restructure even though there is no logical difference, namely, the terminal connection information of the new and old circuit data are the same. Examples are shown below.

1. A net is converted from a TTL system into an ECL system. For example, the system of the output terminal of a new net is converted from a TTL system into an ECL system in the parts terminal technology file 222. In this case, an ECL-system net is automatically restructured.
2. A net remains an ECL system, but the technology of an output terminal is to be changed. For example, the technology name of the output terminal of the new net is changed into another technology name in the parts terminal technology file 222. In this case, the values of the length of an antenna, the length for double connection line, the length of an earth land, and the branch length are changed. Accordingly required again are the ECL antenna, length disconnection process S80 and the ECL double connection line generation process S81.

Practically explained below in detail is a restructure process into an ECL-system net explained above by referring to the flowchart above.

1. Difference extraction process in an ECL-system net (steps S51~S53)

Figure 20:
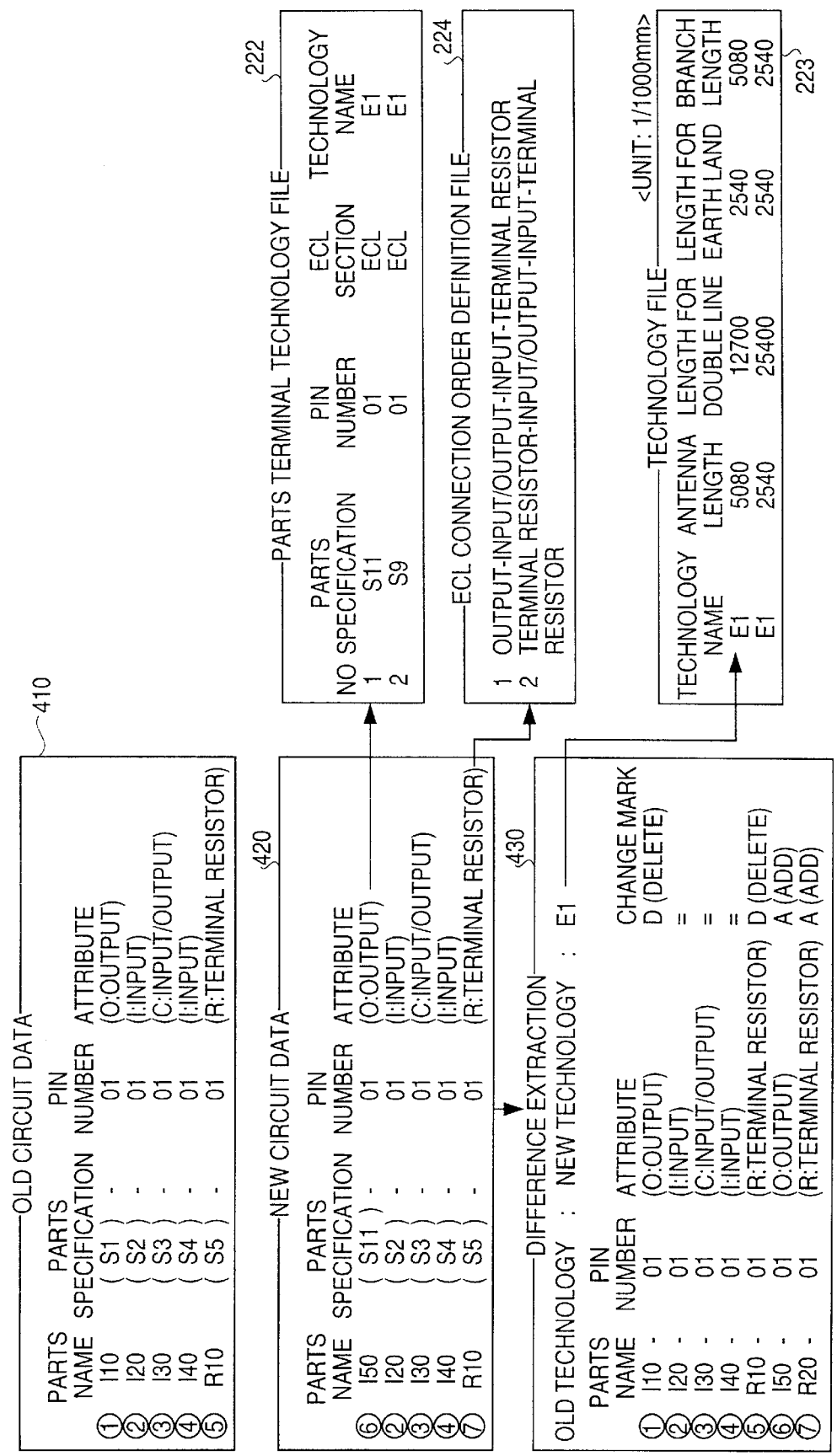
FIG. 20 shows the process of extracting a difference in the ECL-system net.

In FIG. 20, an old circuit data 410 and a new circuit data 420 define connection information of the old and new circuits of a single net to be restructured from a TTL system to an ECL system, and receive pin information in a connection order. The pin information comprises various information such as parts names, parts specifications, pin numbers, and attributes. Attributes are O (output), I (input), C (input/output), and R (terminal resistor). It is determined, by extracting the logical differences between the old circuit data 410 and the new circuit data 420, that these circuits have logical differences. Therefore, generated are difference extraction data 430.

That is, connection is made in the order of I10-01 (output), I20-01 (input), I30-01 (input/output), I40-01 (input), and R10-01 (terminal resistor) in the old circuit. In the new circuit, the connection is changed into the order of I50-01 (output), I20-01 (input), I30-01 (input/output), I40-01 (input), and R20-01 (terminal resistor). Then, the difference between these connections is extracted and:

I10-01 (output) and R10-01 (terminal resistor) are deleted;

I50-01 (output) and R20-01 (terminal resistor) are added; and other pins remain unchanged.

The old circuit data 410 and the new circuit data 420 contain various information (parts names, parts specifications, pin numbers, and attributes). It is determined that the new net is of an ECL system and the technology name is E1 according to the ECL classification information and the technology name information of an object record by referring to the parts terminal technology file 222 using as a key the parts specification S11-pin number 01 of the output pin (output terminal) I50-01 of the new circuit data 420. Thus, the difference extraction data 430 of the new net contain the new technology information E1. The technology name E1 is used as a key when read are data (length of antennas, length for double connection lines, and length of earth lands) to be used in the ECL antenna length disconnection process and the ECL double connection line generation process by referring to the technology file 223. The difference extraction data 430 store various information such as parts name, pin numbers, attributes, and change marks for pins indicating no changes other than delete pins and add pins. Change marks D, A, and = indicate deletion, addition, and no change respectively.

In the new circuit data 420 determined to be an ECL-system net, it is determined by referring to the ECL connection order definition file 224 whether or not the pin connection conforms to the definition of the ECL-system connection order. In this case, the connection is made in the order of output, input/output, input, and terminal resistor as defined first in the ECL connection order definition file 224.

2. Automatic restructure process of an ECL-system net (processes in step S69~S81)

Described below by referring to FIGS. 21A, 21B, and 22C~22F is the method of automatically restructuring a connection pattern of a printed distribution frame according to the difference extraction data 430 of the ECL-system net shown in FIG. 20. In FIGS. 21A, 21B, and 22C~22F, the positions of pins 1~7 indicate the positions of the pins mounted onto the printed distribution frame, and are stored in the difference extraction data 430. E1, E2, and E3 are earth lands, and the broken lines indicate a basic distribution grid.

Figure 21A:
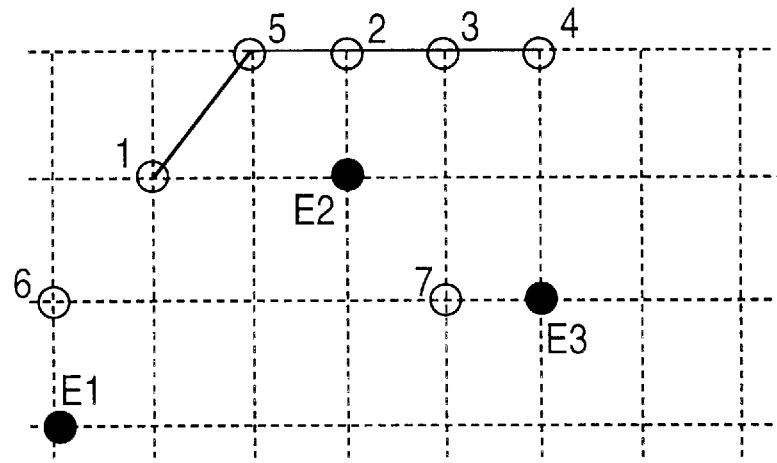
FIGS. 21A and 21B show the automatic restructure process (1) of the ECL-system net.
Figure 21B:
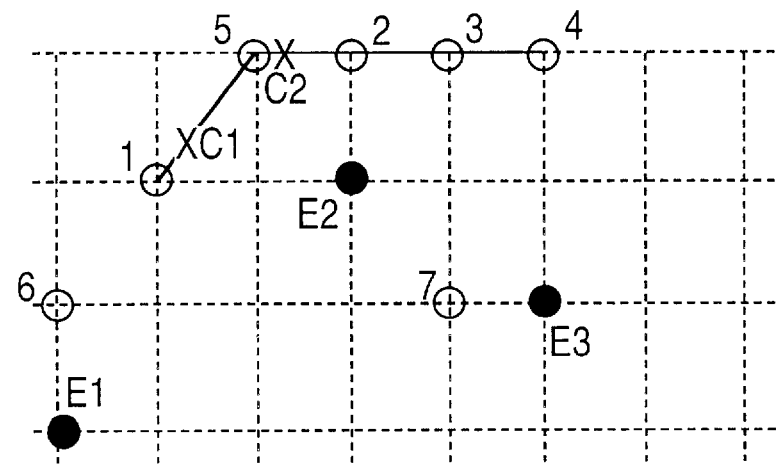

Assume that the old pattern of the printed distribution frame is designed as 1-5-2-3-4 as shown in FIG. 21A according to the old circuit data 410. Since pins 1 and 5 are delete pins according to the difference extraction data 430, the connections between 1 and 5 and between 5 and 2 are disconnected at C1 and C2 as shown in FIG. 21B.

Then, the pattern after the disconnections indicates the connections 2 (I20-01 (input))–3 (I30-01 (input/output))–4 (I40-01 (input)). However, the connection should be made in the order of input/output, input, and input according to the ECL connection order definition file 224 (FIG. 20). Therefore, disconnections are made at C3 and C4 between 2 and 3 and between 3 and 4 as shown in FIG. 22C.

Next, provided are connection lines for the add pins 6 (I50-01 (output)) and 7 (R20-01 (terminal resistor) set in the difference extraction data 430. In this case, the process conforms to the definition of the ECL connection order defined in the ECL connection order definition file 224. Thus, the output pin 6 (I50-01) is connected to the input/output pin I30-01 by connection line J1, and the terminal resistor 7 (R20-01) is connected to the input pin 4 (I40-01) by connection line J2.

Then, it is checked whether or not the net conforms to the ECL connection after the deletion and addition of the pins as shown in FIG. 22D. In this case, since the net does not conform to the ECL connection, connection lines J3 and J4 are added to connect between 2 and 3 and between 2 and 4 respectively as shown in FIG. 22E such that the connection is made according to the ECL connection order of 6 (I50-01 (output)), 3 (I30-01 (input/output)), 2 (I20-01 (input)), 4 (I40-01 (input)), and 7 (R20-01 (terminal resistor)).

After the connection, it is checked whether or not double connection lines are properly generated based on the definition of the ECL net.

That is, it is confirmed that the reference value for double-lines of the technology name E1 is 12700 mm by referring to the technology file 223 (FIG. 20). Since connection line J1 is longer than 12700 mm, the double connection line (earth line) J5 to the line J1 is provided as shown in FIG. 22F. At this time, the line J5 is provided between earth lands E1 and E2. The earth lands E1 and E2 are selected by referring to the length of the earth land 2450 mm of the technology name E1 stored in the technology file 223. That is, it is checked whether or not an earth land exists in the range of the length of the earth land 2540 mm from the pins 6 and 3 provided with the line J1, that is, in the range of the circle of 2540 mm in radius having its centers 6 and 3.

A practical example of the automatic restructure process of a no-logical-difference ECL-system net is explained below by referring to FIGS. 23A~23C, 24A and 24B, 25A~25D, and 26A and 26B.

1. An example of a net where the technology is changed from the TTL-system technology to the ECL-system technology.

Assume that a circuit data 440 of a net are as shown in FIG. 23A. That is, the output terminal I10 (SS1)-01 is defined in the parts terminal technology file 222 as an output terminal of a TTL system having the technology name T1 as shown in FIG. 23B. Thus, the net is of a TTL system. Therefore, the connection order of the terminal is not defined. For example, the connection is made as shown in FIG. 23C.

Figures 24A, 24B:
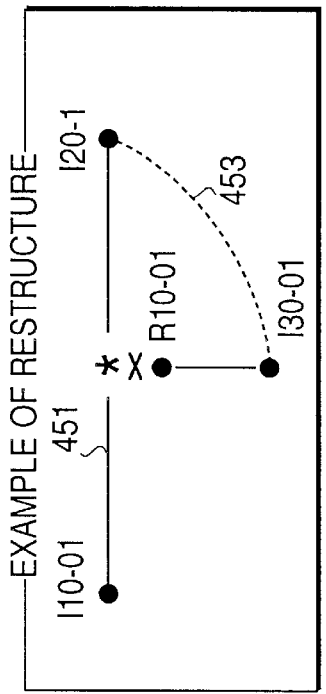
FIGS. 24A and 24B show the automatic restructure (2) of the ECL-system net in which no logical difference is obtained.

Assume that the circuit data of the net remain unchanged as shown in FIG. 23A and the contents of the parts terminal technology file 222 have been changed from those shown in FIG. 23B to those shown in FIG. 24A in the restructure design process. In this case, the technology name of the output terminal I10 (SS1)-01 has been changed into E1, and the output terminal I10 (SS1)-01 has been changed from the TTL system to the ECL system. Therefore, the connection shown in FIG. 23C does not conform to the definition of the connection order of the ECL system net, and the automatic restructure is performed as shown in FIG. 24B. That is, a pattern 451 between I10-01 and I20-01 and a pattern 452 between R10-01 and the pattern 451 are disconnected and I20-01 (input) is connected to I30-01 (input) by the line 453. Thus, the connection is restructured into the connection order of the ECL system, that is, output, input, input, and terminal resistor.

2. The net was of an ECL system in the old version, and the technology name of the output terminal has been changed.

Assume that the circuit data 440 of the initial pattern of a net are shown in FIG. 25A. That is, in the initial version, the output terminal I10 (SS1)-01 of the net is defined in the parts terminal technology file 222 shown in FIG. 25B as an output terminal of the technology name E0 of an ECL system. Thus, the net is connected as shown in FIG. 25D in the initial pattern design process. That is, the input terminal I30-01 is connected as a multipoint connection through a pattern 461 in which I10-01 (input) and I20-01 (input) are connected as a part of the master route and a pattern 462. At this time, the length of the pattern 462 having the branch length of 5000 mm is shorter than the branch length 5080 mm of the technology name E0 shown in FIG. 25C. Thus, the branch length conforms to the definition.

Figures 26A, 26B:
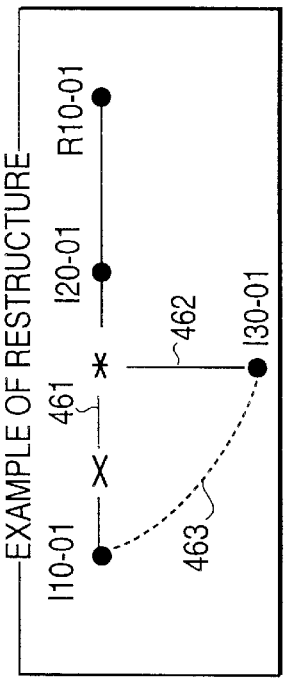
FIGS. 26A and 26B show the automatic restructure (4) of the ECL-system net in which no logical difference is obtained.

Assume that the circuit data 440 of the net remain unchanged as shown in FIG. 25A in the restructure design process and the contents of the parts terminal technology file 222 have been changed from the contents shown in FIG. 25B to the contents shown in FIG. 26A. That is, assume that the technology name of the output terminal I10 (SS1)-01 has been changed from E0 into E1.

In this case, it is necessary that the old net connected according to the connection condition of the technology E0 should be restructured to conform to the connection condition of the technology E1. Thus, the length (5000 mm) of the branch pattern 462 exceeds the branch length 2040 mm of the technology E1, indicating an erroneous branch. Thus, as shown in FIG. 26B, a pattern 461 connecting I10-01 to the branch pattern 462 is disconnected, and a line (common line) 463 is provided between I10-01 and I30-01. As a result, a net is formed as comprising the only master route 110-01 (output), I30-01 (input), I20-01 (input), and R10-01 (terminal resistor). That is, the pattern 462 is not a branch, but a part of the master route, and the above mentioned erroneous error is cleared. Described above is an automatic restructure performed to remove an erroneous branch. Appropriate restructure processes are performed to remove, for example, an antenna length error, double line error, etc.

3. Backup line generation process (process in step S81)

All new disconnections are checked for gaps between adjacent patterns according to all new disconnection information stored in the disconnection information file 203c of the restructure data base 203. If the gap values are smaller than a predetermined value, they are recognized as gap errors. If any gap error exists, it is determined that an adjacent pattern has been disconnected and a backup pattern is generated for the incidentally disconnected pattern. In this case, a gap check is made for the connection pattern of all layers drilled by the object disconnection.

A practical example of the process is explained by referring to FIGS. 27A and 27B.

In FIGS. 27A and 27B, 1~8 indicate pins, vias, etc. Connection patterns 301~304 are formed on a surface layer, and connection patterns 311 and 312 represented by broken lines are formed in the intermediate layers.

As shown in FIG. 27A, connection patterns 301, 302, and 304 are formed on the surface layer between 1 and 3, 3 and 4, and 5 and 6, while connection pattern 303 is formed as a branch to connect 2 to the connection between 3 and 4 in the old version. Formed in the intermediate layer are connection patterns 311 and 312 between 3 and 5, and 7 and 8.

If connection pattern 312 between 7 and 8 in the intermediate layer is disconnected at position C1 under the above described conditions in the old version, then the gap value in the intermediate layer equals the gap value R0 set in the restructure runtime parameter file 221. In this case, the gap value R1 of the surface layer is variable depending on the relative position of the surface layer to the intermediate layer. That is, a coefficient stored in the backup line hierarchical reference parameter file 225 is multiplied by the gap value R0 set in the restructure runtime parameter file 221 to obtain the gap value R1.

That is,

Gap Value R1 of surface layer=backup line hierarchical coefficient×gap value R0

For example, if a surface layer is one layer above an intermediate layer, a coefficient 1.1 is obtained from the backup line hierarchical reference parameter file 225 shown in FIG. 16. If it is two layer above the intermediate layer, obtained is a coefficient value 1.2.

FIG. 27B shows the enlargement of the disconnection point C1 shown in FIG. 27A. As shown in FIG. 27B, an intermediate layer gap check area 401 is in the range of the circle having the radius R0 round the disconnection point C1. A surface layer gap check area 402 is in the range of the circle having the radius R1 round the disconnection point C1. In FIG. 27B, both areas 401 and 402 are drawn as oval, but are actually circles.

The gap checks determine that the connection patterns 303 and 304 of the surface layer are contained in the surface layer gap check area 401, and the connection patterns 303 and 304 are gap errors. Therefore, the connection patterns 303 and 304 are assumed to be disconnected between 3 and 2 and between 5 and 6, and the backup lines J1 and J2 are provided for these areas. Then, as shown in FIG. 28, connection information is set in the connection line information file 203j of the restructure data base 203 for the sections between 3 and 2 and between 5 and 6, and a backup line mark (backup line MK) Q is provided in the line connection information to distinguish the backup line from the common line.

As described above, the necessity of a backup line after a disconnection is automatically checked for all connection line layers. Backup lines are provided for all sections requiring them, and this information is stored in the connection line information file 203j of the restructure data base 203. At this time, the backup line connection information is provided with the backup line mark Q. Thus, the next automatic restructure can be efficiently performed at a high speed because the restructure data base 203 stores common connection lines and backup lines as being distinguished from one another as line connection information. That is, if a net provided with a backup line should be disconnected, it can be disconnected efficiently by disconnecting by priority a section provided with the backup line without physically connecting the backup line (by adding a deletion mark to the connection line data) when the physical connection state of the disconnection net is extracted, thereby preventing a backup line to be generated. On the other hand, if a common connection line is not distinguished from a backup line as in conventional method, the backup line can be recognized only as a common line. Therefore, the backup line is determined to be a common line when a physical connection state is extracted, and the disconnection process for the net should be performed as the deletion (disconnection process) of the backup line and the disconnection of the connection pattern of the net to be disconnected. That is, two disconnection processes are required inefficiently. Even if it is necessary to connect a new add pin to an SMD terminal already provided with a backup line, the backup line is not physically connected (a delete mark is provided for connection line data) when the physical connection of a net provided with a backup line is extracted. Therefore, in the backup line generation process for an add pin, the backup line connection can be optimally reduced for an SMD-terminal-mounted land where the number of backup lines is limited to one. Since the line connection information contains data indicating disconnection (from and to) sections, a section provided with a backup line is informed of by one piece of information. Thus, the line connection information containing a backup line mark Q is read from the restructure data base 203 to easily display a section provided with a backup line on the screen.

Described below is an example of the effect of the connection line data entered as distinguished common lines from backup lines in the connection line information file 203j of the restructure data base 203 by referring to FIGS. 29A~29F, 30, 31A~31B, and 32.

First, an example of efficiently performing an automatic restructure is explained below.

For example, as shown in FIG. 29A, the connection pattern 466 between A and B is disconnected at point C1 in the first restructure process, and it is assumed that adjacent V1 and V2 patterns are provided with a backup line 467. In FIGS. 29A through 29F, C and D are SMD terminals and V1 and V2 are their leader vias. A and B are lands.

Then, assume that it is necessary to disconnect the section between C and D in the subsequent restructure process. In this case, different processes should be followed for the disconnection process for the section between C and D between when the connection line data of the backup line 467 are entered as being recognizable as a backup line using the backup line mark Q in the first restructure process and when they are entered as not being recognizable as a backup line.

a. when the backup line 467 is recognized as a backup line:
1. The backup line is provided for a net not physically disconnected. Therefore, the backup line 467 is not recognized as a physical connection. As shown in FIG. 29B, the section between C and D are physically connected between C and D as C-V1-V2-D.
2. Therefore, as shown in FIG. 29C, the pattern 468 between the leader vias V1 and V2 is disconnected to disconnect the section between C and D. That is, the disconnection data of the pattern 468 are entered in the disconnection information file 203c. Thus, the disconnection process between C and D terminates in a single disconnection process.

b. when the backup line 467 is not recognized as a backup line:
1. In this case, the backup line 467 is recognized as a common line, and the physical connection between C and D is recognized as being made by the line 467 between V1 and V2.
2. To attain this, the line 467 is disconnected between V1 and V2. That is, a delete mark is set in the connection line data of the line (actually a backup line) 467 entered in the connection line information file 203j of the restructure data base 203. Thus, the physical connection between C and D is regarded as the state at the initial design process of C-V1-V2-D as shown in FIG. 29E.
3. Since C and D are SMD terminals, the pattern 468 between the leader vias V1 and V2 is disconnected as shown in FIG. 29F. That is, the disconnection data of the pattern 468 between V1 and V2 are entered in the disconnection information file 203c of the restructure data base 203.

Thus, when the backup line 467 is entered as not being recognized from a common line in the restructure data base 203, it is necessary to perform two disconnection processes on the backup line 467 and the pattern 468 between V1 and V2.

As described above, when connection line data are entered in the restructure data base 203, the format of the connection line data is defined as being recognizable between common lines and backup lines as in the present embodiment. Therefore, the disconnection process of a net provided with a backup line can be quickly performed efficiently in least possible steps.

Described below is another effect obtained by entering the connection line data as being distinguished between common lines and backup lines. First, it is assumed that a backup line is generated according to the connection line generation priority rule shown in FIG. 30.

That is, the priority of the lands provided with backup lines is through-parts lands (through-hole lands equipped with IMD terminals), vias (via-hole lands), SMD parts lands (lands equipped with SMD terminals) in this order. The maximum number of connection lines for the through-parts lands (IMD terminals) is 2, and the maximum number of connection lines for the vias and the SMD parts lands (SMD terminals) is 1. A connection line is not permitted to be provided for a via under management of electronic parts.

Figure 31A:
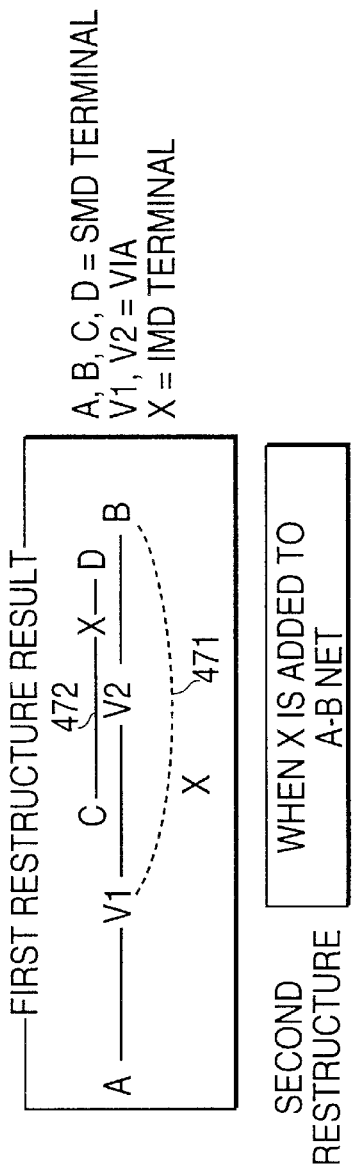
FIGS. 31A and 31B show another example of an effect obtained when a general line and a backup line are entered in the restructure data base in a recognizable format.
Figure 31B:
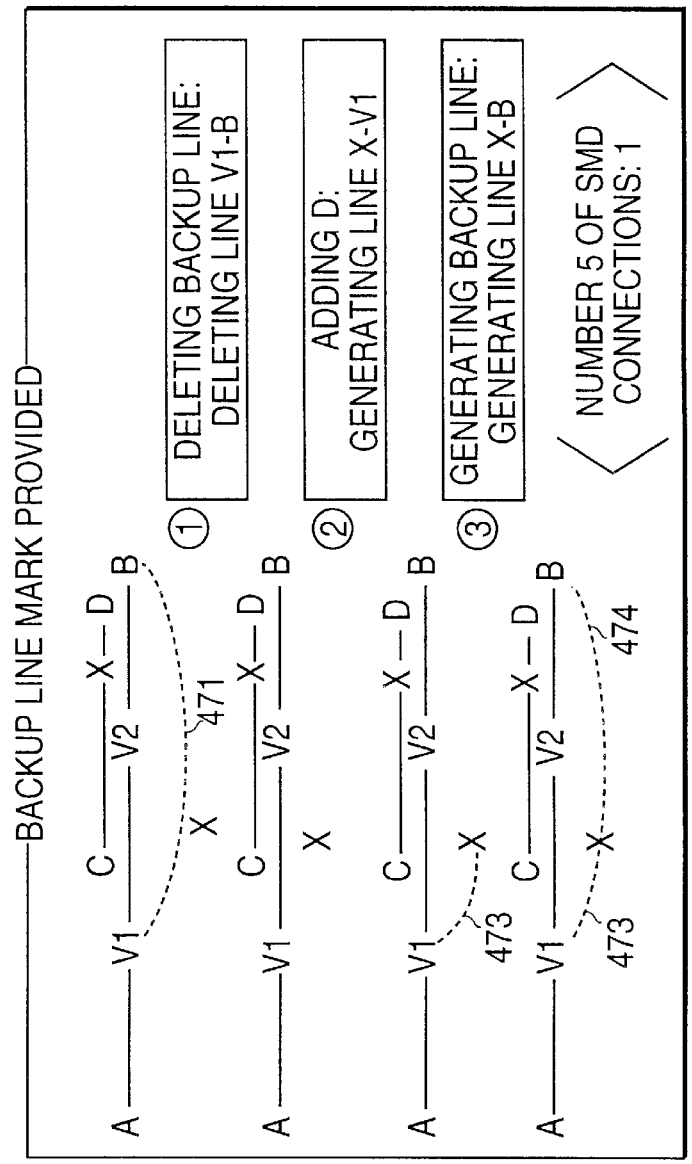

For example, a backup line 471 is generated for the net between A and B as shown in FIG. 31A. That is, the net is connected as A-V1-V2-B, and is provided with the backup line 471 between V1 and B when an adjacent pattern 472 between C and D is disconnected at point X marked in FIG. 31A. In FIGS. 31A and 31B, A, B, C, and D are SMD terminals, and V1 and V2 are leader vias. V2 is under management of electronic parts. X is an IMD terminal.

Since the via V2 is under management of electronic parts, the backup line 471 is provided for the via V1, not for the via V2 closer to an SMD terminal B than the via V1. The connection line data of the backup line 471 are entered in the connection line information file 203j of the restructure data base 203 with the backup line mark Q set properly.

Assume that an IMD terminal X should be added to an A-B net at the second restructure.

In this case, an automatic restructure is performed in the order shown in FIG. 31B according to the present embodiment.
1. Since A is an SMD terminal, the leader via V1 requires the connection of the IMD terminal X. However, the leader via V1 has been already provided with the backup line 471, and the backup line 471 is deleted first.
2. X and V1 are connected by a common line 473.
3. X and B are connected by a backup line 474.

In the processes 1~3 above, the IMD terminal X is added to the A-B net. In this case, the connection of an SMD terminal is made by the backup line 474 to the SMD terminal B.

Figure 32:
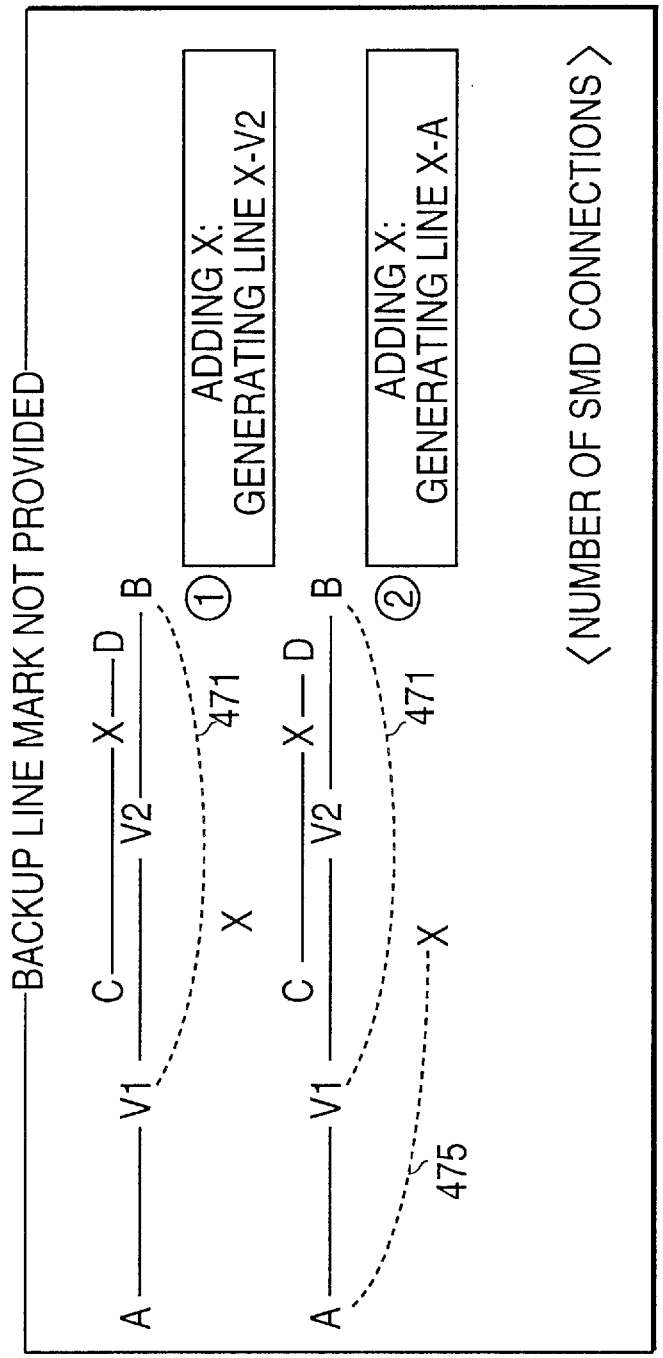
FIG. 32 shows an example of a demerit generated when a general line and a backup line are entered in the restructure data base using the connection line data of the same format.

If the backup line 471 is entered in the connection line information file 203j of the restructure data base 203 as in the case of a common line, then the automatic restructure is performed in the procedure shown in FIG. 32.
1. As in 1. in the explanation made by referring to FIGS. 31A and 31B, A is an SMD terminal and its leader via V1 requires the connection of the IMD terminal X. However, the leader via V1 has already been provided with the line 471. At this time, since the line data are not assigned a backup line mark, the line 471 recognized as a common line although it is actually a backup line. Therefore, the line 471 is not deleted and the IMD terminal X is connected to the SMD terminal B, and a trial is made to provide a line between the leader via V2 and the IMD terminal X. Since the via V2 is under management of electronic parts, the trial is abandoned.
2. Since the IMD terminal X is connected to the SMD terminal A with a connection line, a connection line 475 is provided between X and A. Thus, the IMD terminal X is added to the A-B net. In this case, the number of the connection lines for the SMD terminal is 2, that is, the line 475 for the SMD terminal A and the line 471 for the SMD terminal B.

If common lines and backup lines are not entered in the restructure data base 203 as distinguished from one another, then the number of the connection lines for the SMD terminals possibly increases, which undesirably affects the circuits.

4. Connection route input process

Figure 33:
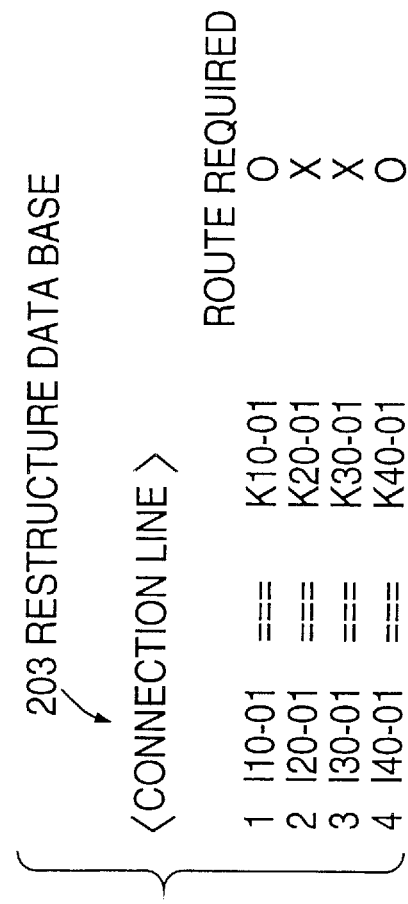
FIG. 33 shows the method of defining a route request mark in the connection line data in the restructure data base.

After the process in step S82, the connection line information file 203j of the restructure data base 203 contains a route request mark (marked with a circle) for connection line data for which a connection route should be established by the designer. In the example shown in FIG. 33, connection routes should be provided for the sections between I10-01 and K10-01 and between I40-01 and K40-01. On the other hand, no connection route is required for the lines provided for the sections between I20-01 and K20-01 and between I30-01 and K30-01.

The restructure editor according to the present embodiment reads connection line information from the connection line information file 203j of the restructure data base 203, and a section provided with a connection line and assigned the route request mark is informed of on the graphic display as the screen data as shown in FIG. 34A. That is, connection lines 510 and 540 which require respective connection routes are displayed on the screen. Thus, the designer is easily informed of the necessity of setting connection routes between I10-01 and K10-01 and between I40-01 and K40-01.

Then, the designer enters a connection route 512 shown by broken lines in FIG. 34B as a connection route to be provided for the section between I10-01 and K10-01. That is, the connection route 512 is entered by specifying the positions of R1 and R2 using a pointing device, etc. The restructure editor displays by broken lines a straight line connecting I10-01 and R1, R1 and R2, and R2 and K10-01, and displays the connection route 512 represented by the combination of the broken lines.

When the designer enters a connection route 542 between I40-01 and K40-01, he or she enters R3, that is, an intersection of the horizontal line passing I40-01 and the vertical line passing K40-01 as shown in FIG. 34B. Thus, the restructure editor displays by broken lines respective straight lines connecting I40-01 and R3, and R3 and K40-01. Then, the connection route 542 is displayed as being provided as a combination of those broken lines between I40-01 and K40-01.

When the designer enters the two connection routes 512 and 542, the input information is copied to the connection line information file 203j and the connection line route information file 203r of the restructure data base 203. For example, route numbers 1 and 2 are assigned to the connection routes 512 and 542. Then, as shown in FIG. 34C, these route numbers are assigned to route points of the connection line data corresponding to the connection lines provided between I10-01 and K10-01 and between I40-01 and K40-01 in the connection line information file 203j.

The restructure editor enters the information of the connection routes 512 and 542 input to the connection line route information file 203r. As shown in FIG. 34C, the information comprises three items, that is, a route number, the number of points, and the position of the points. The positions of the points are specified at the entry of connection routes, and are indicated by R1, R2, and R3 shown in FIG. 34C. The number of points equals the number of the positions of the above mentioned points.

Therefore, the connection route information of the connection route 512 is represented as {1 (route number), 2 (number of points), R1, R2 (point positions)}. The connection route information of the connection route 542 is represented as {2 (route number), 1 (number of points), R3 (point position)}.

Thus, the restructure editor automatically displays connection lines to be assigned respective connection routes according to the present embodiment. The designer enters the connection routes by operating the restructure editor and specifying the point position at which the connection route is assigned to the connection line. The connection route information is stored in the restructure data base 203 as being linked to corresponding connection line data. That is, the connection route is centrally managed with existing restructure data, thereby realizing easy management of the connection routes.

5. Processing leader via connected to SMD terminal as virtual pin (processes in steps S59, S63, S70, and S75).

Assume that a net containing an SMD terminal has been restructured and difference extraction data are obtained as shown in FIG. 35A. In FIG. 35A, A and X are SMD terminals, while B, C, D, and Y are, for example, IMD pins.

FIG. 35B shows a connection pattern before a restructure process. As shown in FIG. 35B, the SMD terminal A is connected to pin B via a leader via V1. Pin B is connected to pins C and D. A leader via V2 is connected to the SMD terminal X. Under the present conditions, the net is restructured according to the difference extraction data shown in FIG. 35A.

Since the SMD terminal A is a delete pin, it is necessary to disconnect the connection line between the SMD terminal A and pin B. Assuming that the leader via V1 is a virtual pin of the SMD terminal A, a pattern 601 between the virtual pin V1 and pin B is disconnected at C1. Thus, a connection line can be generated through the leader via (virtual pin) V1 when the SMD terminal A is used in the next restructure process. Since the SMD terminal A is not directly provided with a connection line, thermal stress generated in a soldering process can be prevented from being applied to the SMD terminal A.

Next, the SMD terminal X is added by processing its leader via V2 as a virtual pin of the SMD terminal X and generating a connection line from the virtual pin V2 to pin C. Likewise, no direct connection line is provided between pin Y and the SMD terminal X, but is generated for the virtual pin V2 of the SMD terminal X. Thus, according to the present embodiment, a leader via of the SMD terminal is regarded as a virtual pin, and the connection to the leader via is disconnected when the SMD terminal is a delete pin. When the SMD terminal is an add pin, its leader via is provided with a connection line. These processes are performed through an automatic restructure. Using the leader via of the SMD terminal, fewest possible leader lines from the SMD terminal can be disconnected to minimize the opportunities of generating direct connection lines for the SMD terminal, thereby preventing the deterioration of the SMD at the restructure process.

6. Backup line editing process by the restructure editor

As described above, backup line data are stored in the connection line route information file 203r of the restructure data base 203 as being recognizable from common connection line data. Therefore, the restructure editor reads connection line data from the connection line route information file 203r to provide the following editing capabilities for the designer.

1. When a screen is displayed to add or delete a connection line, a backup line is displayed as being distinguished from a common connection line (for example, common connection lines and backup lines are represented by solid lines and broken or bold lines).

2. A backup line can be input on the display screen.

3. When a connection line delete command is input, it is determined whether or not a deletion-specified connection line is a backup line. If yes, the designer is prompted on the screen to enter the acknowledgement of the deletion.

4. If a connection pattern is disconnected, an adjacent pattern is checked whether or not it is to be provided with a backup line. If yes, the backup line is automatically displayed on the screen.

A practical example of a backup line editing process performed by the restructure editor is explained by referring to FIGS. 36A~36L.

Assume that connection line data are stored in a connection line information file 200j of the surface-mounting data base 200 as shown in FIG. 36A. That is, the connection line data indicate common connection lines between terminals E and F and between terminals F and D, and a backup line between terminals Y and X. Though not shown in FIG. 36A, the common line and backup line data store coordinates of connection lines on a printed distribution frame.

When the restructure editor receives a command to edit the common and backup lines, it reads the common and backup line data, the initial pattern data, etc. shown in FIG. 36A from the surface-mounting data base 200, and displays on the graphic display the backup line edition screen as shown in FIG. 36B. The screen shown in FIG. 36B displays the connection patterns between A and B, C and D, and G and H in addition to the above described common connection lines between E and F and between F and D and the backup line 701 between Y and X. On the display screen, the common and backup lines are represented by solid and broken lines respectively as being distinguished from one another. As shown in FIG. 36B, a backup line 701 between Y and X is generated by disconnecting the pattern between adjacent A and B.

If the designer enters and executes (FIG. 36C) a connection line delete command, and selects the connection line between Y and X as a line to be deleted (FIG. 36D), then the restructure editor recognizes that a backup line mark is set in the backup line data of the section between Y and X. Then, it outputs on the graphic display screen a warning message "A backup line has been selected. Is it to be deleted? Enter Yes or No."

In this case, the designer enters Yes if the backup line 701 between Y and X can be deleted, but otherwise No. Upon receipt of either of Yes or No from the designer, the restructure editor performs a corresponding line generation process, and displays the result on the screen (FIG. 36F). That is, when the backup line 701 between Y and X has been deleted (if Yes is input), then the backup line 701 between Y and X is deleted.

If the designer enters a command to instruct the pattern 702 between G and H to be disconnected when the screen shown in FIG. 36B is displayed (FIG. 36G), then a backup line generation check (FIG. 36H) is made to check whether or not any section requires the generation of a backup line when the pattern 702 between G and H is disconnected as described in 3. Backup line generation process. Then, a section requiring the generation of a backup line is detected, then the backup line is displayed on the graphic display (FIG. 36I).

In the connection shown in FIG. 36B, the gap between the G-H pattern 702 and the C-D pattern 703 is smaller than a gap value stored in the restructure runtime parameter file 221. Therefore, it is determined that a backup line 705 should be provided between C and D, and the backup line 705 is displayed between C and D as shown in FIG. 36J.

When the backup line 705 is displayed, a message is also displayed on the screen prompting "Is the backup line is correctly designed on the screen? Enter Yes or No." (FIG. 36K) The designer enters Yes or No in response to this message. If the backup line 705 displayed by the restructure editor is allowed to be generated, then the designer enters Yes, but otherwise No. If No is entered, the restructure editor clears the backup line 705 as shown in FIG. 36L. That is, the connection line data of the backup line 705 are not entered in the restructure data base 203. If Yes is entered, the restructure does not refresh the screen shown in FIG. 36J, but enters connection line data of the backup line 705, that is, the connection line data containing a backup line mark in the connection line information file 203j of the restructure data base 203.

As a method other than that shown in FIGS. 36A~36L, a command can be issued by the designer to specify a section to be provided with a backup line, and the restructure editor enters data of the specified backup line in the connection line information file 203j of the restructure data base 203 when the command is entered. In this method, the designer is allowed to generate a backup line at any point on the screen.

According to the above described embodiment, an ECL-system net is restructured. However, the present invention is not limited to this application, and can be applied to a net of another logic level where the connection order of terminals is limited as in the case of the ECL-system net. In this case, the technology file 223 stores a reference value for use in a mounting design such as connection conditions based on each technology.

As described above, the present invention obtains the following effect.

1. Since a net whose terminal connection order is limited such as an ECL system net is automatically detected and the net is automatically restructured in the limited order or under specified connection conditions. Therefore, the restructuring operation can be quickly performed in a shorter time and the restructure result is more precise and reliable compared with conventional manual operations. Furthermore, since the restructure result can be copied to a data base, a special net such as ECL-system nets, which have not been managed in a data base, can be managed as properly as TTL-system nets.

2. It can be determined automatically, quickly, and exactly whether or not a backup line can be generated when a pattern is disconnected in a dense package. Furthermore, the existence of a backup line can be exactly detected in a connection layer, too complicated to be manually processed, other than a disconnected layer. An example of this layer is an inner pattern disconnected in a multilayer connection. Since a backup line is entered in a restructure data base as being distinguished from a common connection line, a subsequent automatic restructure process can be performed efficiently and quickly. Using a restructure editor and other tools, a backup line edit process can be easily performed on the screen in, for example, an conversational mode.

3. If a connection route is required, a corresponding section is automatically displayed on the screen. Accordingly, the designer can easily enter and set a connection route on the screen in an conversational mode. Furthermore, since the connection route information is entered in the restructure data base as being linked with corresponding connection line data, the connection route information can be collectively managed with the corresponding connection line data.

4. If a surface-mounted parts terminal is disconnected or a connection line is generated, then the leader via of the surface-mounted parts terminal is virtually regarded as a pin, and a pattern connected to the virtual pin is disconnected or a connection line is generated for the virtual pin. Therefore, the disconnections of patterns connecting the surface-mounted parts terminal and the leader via can be minimized for efficient use. Since opportunities of directly providing connection lines can be optimally reduced, the surface-mounted parts terminal can be prevented from being deteriorated by excess thermal stress of, for example, a soldering device.

What is claimed is:

1. A restructure support device for a printed distribution frame, comprising:

circuit data inputting means for inputting old circuit data and new circuit data of a net when one or more than two components are replaced by other special type components, where the old and new circuit data may be identical or different;

net determination information storage means for storing information required to determine, based on the inputted new circuit data of the net, whether the net is of a high-speed signal net such as an ECL-system net as a special system including the special type components whose terminal connection order is restricted;

connection information storage means for storing connection order information defining the terminal connection order in the net of the special system;

net determining means for determining whether the new circuit data of the net is of the special system based on the new circuit data and net determination information stored in said net determination information storage means; and restructure data generating means for generating connection restructure data required to connect on a printed distribution frame all terminals of the new circuit data of the net which is determined by said net determining means to be of the special system based on the old circuit data and the new circuit data, according to the connection order information stored in said connection information storage means.

2. The restructure support device according to claim 1, wherein said net of the special system is said ECL-system net for receiving and outputting a signal at an ECL level.

3. The restructure support device according to claim 2, further comprising:

connection condition information storage means for defining connection conditions of said ECL-system net, wherein said restructure data generating means generates the connection restructure data according to the connection conditions stored in said connection condition information storage means.

4. The restructure support device according to claim 3, wherein said connection conditions refer to a limited length of an antenna; and said restructure data generating means generates the connection restructure data to disconnect the antenna when an antenna longer than the limited length is generated by disconnecting a connection pattern.

5. The restructure support device according to claim 3, wherein said connection conditions refer to a connection line length requiring generation of double lines; and said restructure data generating means generates the connection restructure data indicating the generation of the double lines between earth lands if a newly generated line is longer than the connection line length requiring the generation of the double lines.

6. The restructure support device according to claim 5, wherein said connection conditions define a retrieval range of the earth lands to be provided with the double lines; and said restructure data generating means selects by priority earth lands which can be provided with a connection line from each end of the newly generated line in the retrieval range.

7. The restructure support device according to claim 3, wherein said connection conditions refer to a limited length of a branch from a master route; and said restructure data generating means determines connection of terminals in consideration of the limited length of the branch in addition to the connection order information.

8. A restructure support device for a printed distribution frame comprising:

reference value storage means for storing a reference value of a distance between a pattern and an adjacent pattern;

a restructure database; and backup line data generating means for comparing, when disconnecting the pattern according to information stored in said restructure database, the reference value of the distance between the pattern and the adjacent pattern based on the reference value stored in said reference value storage means, and for generating backup line data to provide a backup line for the adjacent pattern when the adjacent pattern can also be disconnected due to the disconnection of the pattern, said backup line data generating means generating the backup line for an ECL-system net and storing the backup line data in said restructure data base such that the backup line data can be distinguished from common line data.

9. The restructure support device according to claim 8, wherein said reference value storage means also stores in addition to a reference value for the adjacent pattern in the same layer as the disconnected pattern a reference value for a pattern adjacent to a corresponding point in a layer which can be disconnected in association with the disconnection of the pattern.

10. The restructure support device according to claim 8, wherein said backup line data generating means stores in said restructure data base the backup line data for an ECL-system net as being associated with a disconnected section.

11. A restructure support device for a printed distribution frame, comprising:

circuit data inputting means for inputting old circuit data and new circuit data of a net when one or more than two components are replaced by other special type components, where the old and new circuit data may be identical or different;

net determination information storage means for storing net determination information required to determine based on the inputted new circuit data of the net whether the net is of a high-speed signal net such as an ECL-system net as a special system including the special type components whose terminal connection order is restricted;

connection condition information storage means for defining connection conditions of the net of the special system;

net determining means for determining whether the new circuit data of the net is of the special system based on the new circuit data and the net determination information stored in said net determination information storage means; and restructure data generating means for generating, based on the new circuit data, restructure data for the net as determined by said net determining means to be of the special system, according to the connection conditions stored in said connection condition information storage means.

12. A restructure support device according to claim 11, further comprising:
    display means for displaying a section where a connection route is required after reading connection line data including information, received from a restructure data base storing restructure information of the printed distribution frame, indicating that the connection route should be assigned;
    input means for setting and entering the connection route where the connection route is required on a screen displayed by said display means; and
    connection route information generating means for storing, in association with corresponding connection line data, connection line route information entered by said input means.

13. The restructure support device according to claim 11, wherein
    said net determined to be of the special system is an ECL-system net for receiving and outputting a signal at an ECL level.

14. A restructure support device according to claim 11, further comprising:
    determining means for determining, if a connection line is generated, whether or not a connection route should be defined for the connection line; and
    connection line data generating means for generating connection line data including information that the connection route should be defined for the connection line determined by said determining means to be assigned the connection route.

15. A restructure support device according to claim 11, further comprising:
    determining means for determining whether or not a leader via is connected to a surface-mounted parts terminal to be deleted in a new net; and
    disconnection data generating means for generating disconnection data specifying disconnection of a pattern connected to the leader via of the surface-mounted parts terminal determined by said determining means to be connected to the leader via.

16. A restructure support device according to claim 11, further comprising:
    determining means for determining whether or not a leader via is connected to a surface-mounted parts terminal to be added in a new net; and
    connection line data generating means for generating connection line data specifying connection of a connection line to the surface-mounted parts terminal determined by said determining means to be connected to the leader via.

17. A restructure support device according to claim 11, further comprising:
    determining means for reading connection line data from a restructure data base storing common and backup line data and determining whether the connection line data refer to the common line data or the backup line data; and
    display means for displaying a common line and a backup line as being distinguished from one another based on a determination result of said determining means.

18. The restructure support device according to claim 17, further comprising:
    editing means for receiving on a screen from said display means a command relating to a connection line and performing a process on the connection line in response to the command.

19. The restructure support device according to claim 18, wherein
    said editing means enters a connection line data of a backup line in the restructure data base when a command is entered to generate the backup line for a section displayed on the screen.

20. The restructure support device according to claim 18, wherein
    said editing means displays a message inquiring whether or not a backup line can be deleted when a command is entered to specify deletion of the backup line.

21. The restructure support device according to claim 20, wherein
    said editing means deletes a backup line data of the backup line from the restructure data base if a message is entered acknowledging the deletion of the backup line in response to the inquiring message.

22. The restructure support device according to claim 18, wherein
    said editing means further comprises:
        detecting means for detecting, when said display means issues a command to disconnect a connection pattern of a section on the screen, another section whose connection pattern can be disconnected in association with a disconnection made according to the command; and
    backup line generating means for displaying a backup line on the screen for the section detected by said detecting means.

23. The restructure support device according to claim 22, wherein
    said backup line generating means displays on the screen a message inquiring whether or not the displayed backup line can be entered.

24. The restructure support device according to claim 23, wherein
    said backup line generating means enters connection line data of the backup line in said restructure data base when the message is answered by an input acknowledging that the entry of the backup line is allowed.

25. A restructure support method for a printed distribution frame, comprising:
    inputting old circuit data and new circuit data of a net when one or more than two components are replaced by other special type components, where the old and new circuit data may be identical or different;
    determining whether the net is of a high-speed signal net such as an ECL-system net as a special system including the special type components based on the new circuit data of the net and net determination information required to determine whether the net is of the special system in which terminal connection order is restricted; and
    if the net is determined to be of the special system, generating connection restructure data required to connect on the printed distribution frame all terminals of a new circuit of the net based on the old circuit data and the new circuit data according to connection order information defining the terminal connection order in the net of the special system.

26. A restructure support method according to claim 25, further comprising:

determining whether a connection line should be assigned a connection route when the connection line is generated;

generating connection line data including information specifying that the connection route should be assigned to the connection line determined to be provided with the connection route; and entering the connection line data in a restructure data base.

27. A restructure support method according to claim 25, further comprising:

generating a restructure database;

detecting a pattern and an adjacent pattern both of which can be disconnected by referring to a reference value of a distance between the pattern and the adjacent pattern, when the pattern needs to be disconnected according to information stored in said restructure database; and generating data to provide a backup line for the adjacent pattern which is detected to be disconnected due to a disconnection of the pattern.

28. A restructure support method for a printed distribution frame, comprising:

inputting old circuit data and new circuit data of a net when one or more than two components are replaced by other special type components, where the old and new circuit data may be identical or different;

determining whether the net is of a high-speed net such as an ECL-system net as a special system including the special type components based on the new circuit data of the net and net determination information required to determine whether the net is of the special system in which terminal connection order is restricted; and if the net is determined to be of the special system, generating restructure data based on the new circuit data according to connection condition information defining connection conditions of the special system.

29. A restructure support method according to claim 28, further comprising the steps of:

reading connection line data from a restructure data base storing common line data and backup line data;

determining whether the read connection line data refer to a common line or a backup line; and displaying on a screen the common line and the backup lines in a format of distinguishing the common line from the backup line based on a determination result.

30. A restructure support method according to claim 28, further comprising the steps of:

determining whether or not a surface-mounted parts terminal to be deleted in a new net is connected to a leader via; and generating disconnection data to specify disconnection of a pattern connected to the leader via of the surface-mounted parts terminal determined to be connected to the leader via.

31. A restructure support method according to claim 28, further comprising the steps of:

determining whether or not a surface-mounted parts terminal to be added in a new net is connected to a leader via; and generating connection line data specifying connection of a connection line to the leader via of the surface-mounted parts terminal determined to be connected to the leader via.

32. A restructure support method according to claim 28, further comprising the steps of:

reading from a restructure data base storing restructure information of the printed distribution frame connection line data including information specifying assignment of a connection route;

displaying on a screen a section where the connection route should be set;

setting and entering the connection route for the section where the connection route should be set; and storing entered connection route information as being linked with the connection line data in the restructure data base.

* * * * *